United States Patent
Hayashi et al.

(10) Patent No.: US 9,136,460 B2
(45) Date of Patent: Sep. 15, 2015

(54) PIEZOELECTRIC ELEMENT, METHOD FOR MANUFACTURING PIEZOELECTRIC ELEMENT, AND ELECTRONIC APPARATUS

(71) Applicant: CANON KABUSHIKI KAISHA, Tokyo (JP)

(72) Inventors: Jumpei Hayashi, Yokohama (JP); Toshihiro Ifuku, Yokohama (JP); Hisato Yabuta, Machida (JP); Yasushi Shimizu, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/606,399

(22) Filed: Jan. 27, 2015

(65) Prior Publication Data
US 2015/0214470 A1 Jul. 30, 2015

(30) Foreign Application Priority Data
Jan. 29, 2014 (JP) ................. 2014-014469

(51) Int. Cl.
| | |
|---|---|
| B41J 2/045 | (2006.01) |
| H01L 41/187 | (2006.01) |
| B41J 2/14 | (2006.01) |
| H02N 2/00 | (2006.01) |
| G02B 27/00 | (2006.01) |
| B06B 1/06 | (2006.01) |

(52) U.S. Cl.
CPC .......... H01L 41/1871 (2013.01); B06B 1/0644 (2013.01); B41J 2/14201 (2013.01); B41J 2/14233 (2013.01); G02B 27/0006 (2013.01); H01L 41/1878 (2013.01); H02N 2/001 (2013.01)

(58) Field of Classification Search
CPC .... B41J 2/14201; B41J 2/14233; B41J 2/274; B41J 2/161; B41J 2/1612
See application file for complete search history.

(56) References Cited

U.S. PATENT DOCUMENTS
7,652,408 B2 * 1/2010 Fujii ............................. 310/311

FOREIGN PATENT DOCUMENTS
| | | |
|---|---|---|
| EP | 2141752 A1 | 1/2010 |
| JP | 2009215111 A | 9/2009 |
| WO | 2013/005701 A1 | 1/2013 |
| WO | 2013/005702 A1 | 1/2013 |

OTHER PUBLICATIONS

Japanese Journal of Applied Physics, 2010, vol. 49, 09MD03-1 to 09MD03-4.
U.S. Appl. No. 14/606,401, filed Jan. 27, 2015.

* cited by examiner

*Primary Examiner* — Juanita D Jackson
(74) *Attorney, Agent, or Firm* — Canon U.S.A. Inc., IP Division

(57) ABSTRACT

A piezoelectric element includes a piezoelectric material portion. The piezoelectric material portion is made of a piezoelectric ceramic that includes a perovskite-type metal oxide including barium titanate and Mn and that has residual polarization. The piezoelectric material portion has a measurement surface extending in a direction that crosses a direction of the residual polarization of the piezoelectric ceramic, and, after the measurement surface has been polished to have a surface roughness of 200 nm or less, the measurement surface has a (002)/(200) X-ray diffraction intensity ratio of 1.0 or more at room temperature. A ratio c/a of a c-axis lattice constant c to an a-axis lattice constant a of the piezoelectric ceramic at room temperature satisfies $1.004 \leq c/a \leq 1.010$. A half-width of a (002) diffraction peak of the measurement surface at room temperature is 1.2° or less.

18 Claims, 16 Drawing Sheets

PIEZOELECTRIC ELEMENT, METHOD FOR MANUFACTURING PIEZOELECTRIC ELEMENT, AND ELECTRONIC APPARATUS

BACKGROUND OF THE INVENTION

1. Field of the Invention

The present invention relates to a lead-free piezoelectric element and a method for manufacturing the lead-free piezoelectric element. The present invention also relates to a liquid ejection head, a liquid ejection apparatus, an ultrasonic motor, an optical device, a vibration device, a dust removing device, an imaging apparatus, and an electronic apparatus, each including the piezoelectric element.

2. Description of the Related Art

Metal oxides having a perovskite structure, such as lead zirconate titanate (hereinafter, referred to as "PZT"), are generally used as piezoelectric ceramics for piezoelectric elements. However, PZT, which includes lead, has a problem in that it causes environmental pollution. Therefore, development of lead-free piezoelectric ceramics is desired.

Barium titanate is a known example of a lead-free piezoelectric ceramic. Materials based on barium titanate have been developed to improve the characteristics of a lead-free piezoelectric ceramic.

Japanese Patent Laid-Open No. 2009-215111 describes a material in which some of A sites of barium titanate are replaced with Ca and some of B sites of barium titanate are replaced with Zr in order to improve the piezoelectric characteristics of barium titanate. This material has a phase transition temperature at a temperature near room temperature and has an improved piezoelectric constant at a temperature near room temperature due to an increase in relative permittivity.

However, this material, which has improved piezoelectric characteristics due to an increase in the relative permittivity, has a problem in that the power consumption of a piezoelectric element made from this material is high.

SUMMARY OF THE INVENTION

The present invention provides a piezoelectric element that has a high electromechanical coupling factor, that consumes low electric power, and that is lead-free. The present invention also provides a method for manufacturing the piezoelectric element. The present invention further provides a liquid ejection head, a liquid ejection apparatus, an ultrasonic motor, an optical device, a vibration device, a dust removing device, an imaging apparatus, and an electronic apparatus, each including the piezoelectric element.

According to a first aspect of the present invention, a piezoelectric element includes a first electrode, a piezoelectric material portion, and a second electrode. The piezoelectric material portion is made of a piezoelectric ceramic that includes a perovskite-type metal oxide including barium titanate and Mn and that has residual polarization. The piezoelectric material portion has a measurement surface extending in a direction that crosses a direction of the residual polarization of the piezoelectric ceramic, and, after the measurement surface has been polished to have a surface roughness of 200 nm or less, the measurement surface has a (002)/(200) X-ray diffraction intensity ratio of 1.0 or more at room temperature. A ratio c/a of a c-axis lattice constant c to an a-axis lattice constant a of the piezoelectric ceramic at room temperature satisfies $1.004 \leq c/a \leq 1.010$. A half-width of a (002) diffraction peak of the measurement surface at room temperature is 1.2° or less.

According to a second aspect of the present invention, a method for making the piezoelectric element includes the sequential steps of making a compact composed of a powder material, obtaining a piezoelectric ceramic by sintering the compact, forming a first electrode and a second electrode on the piezoelectric ceramic, and polarizing the piezoelectric ceramic. The step of forming the first electrode and the second electrode on the piezoelectric ceramic includes heat-treating the piezoelectric ceramic, the first electrode, and the second electrode in a temperature range having a highest temperature from 700° C. to 900° C. and cooling the piezoelectric ceramic, the first electrode, and the second electrode at a rate of 100° C./h or more.

According to a third aspect of the present invention, a liquid ejection head includes a liquid chamber provided with a vibration unit including the piezoelectric element, and an ejection port connected to the liquid chamber.

According to a fourth aspect of the present invention, a liquid ejection device includes a placement portion for placing a transferred object thereon, and the liquid ejection head.

According to a fifth aspect of the present invention, an ultrasonic motor includes a vibration body including the piezoelectric element, and a movable body that contacts the vibration body.

According to a sixth aspect of the present invention, an optical device includes a driving unit including the ultrasonic motor.

According to a seventh aspect of the present invention, a vibration device includes a vibration body including a diaphragm and the piezoelectric element on the diaphragm.

According to an eighth aspect of the present invention, a dust removing device includes a vibration unit including the vibration device.

According to a ninth aspect of the present invention, an imaging apparatus includes the dust removing device, and an imaging element unit. The diaphragm of the dust removing device is disposed on a light-receiving side of the imaging element unit.

According to a tenth aspect of the present invention, an electronic apparatus includes a piezoelectric acoustic component including the piezoelectric element.

The present invention can provide a piezoelectric element that has a high electromechanical coupling factor and low power consumption and that does not include lead or an alkali metal. The present invention can also provide and a method for manufacturing the piezoelectric element.

The present invention can further provide a liquid ejection head, a liquid ejection apparatus, an ultrasonic motor, an optical device, a vibration device, a dust removing device, an imaging apparatus, and an electronic apparatus, each including the piezoelectric element.

Further features of the present invention will become apparent from the following description of exemplary embodiments with reference to the attached drawings.

DESCRIPTION OF THE EMBODIMENTS

Hereinafter, embodiment of the present invention will be described.

A piezoelectric element according to the present invention includes a first electrode, a piezoelectric material portion, and a second electrode. The piezoelectric material portion is made of a piezoelectric ceramic that includes a perovskite-type metal oxide including barium titanate and Mn and that has residual polarization. The piezoelectric material portion has a measurement surface extending in a direction that crosses a direction of the residual polarization of the piezoelectric ceramic, and, after the measurement surface has been polished to have a surface roughness of 200 nm or less, the measurement surface has a (002)/(200) X-ray diffraction intensity ratio of 1.0 or more at room temperature. A ratio c/a of a c-axis lattice constant c to an a-axis lattice constant a of the piezoelectric ceramic at room temperature satisfies $1.004 \leq c/a \leq 1.010$. A half-width of a (002) diffraction peak of the measurement surface at room temperature is 1.2° or less.

The present invention provides a piezoelectric element that is composed of a barium titanate ceramic and that consumes low electric power by controlling the microstructure of the barium titanate ceramic to improve the electromechanical coupling factor thereof.

Figure 1:
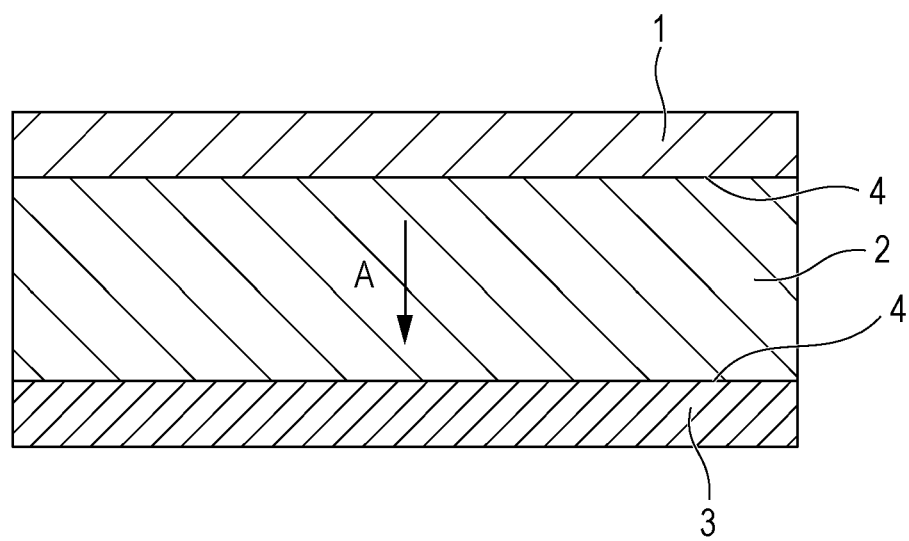
FIG. 1 is a longitudinal sectional view of a piezoelectric element according to an embodiment of the present invention.

A piezoelectric element according to the present invention includes a first electrode 1, a piezoelectric material portion 2, and a second electrode 3. FIG. 1 is a longitudinal sectional view of the piezoelectric element according to an embodiment of the present invention. For example, the first electrode 1 and the second electrode 3, each shaped like a rectangular-parallelepiped, are attached to the piezoelectric material portion 2, which is shaped like a rectangular-parallelepiped.

Arrow A indicates the direction of residual polarization. The first electrode 1 and the second electrode 3 are disposed on opposite surfaces of the piezoelectric material portion 2. FIG. 1 illustrates longitudinal sections of the piezoelectric material portion 2, which is shaped like a rectangular-parallelepiped, and the first and second electrodes of the piezoelectric element, the longitudinal sections being taken along a plane extending in the direction of residual polarization. The shape of the piezoelectric material portion 2 is not limited to a rectangular-parallelepiped, and may be a cylinder or a polyhedron. The dispositions and the shapes of the first electrode 1 and the second electrode 3 are not limited to these, and may be patterned in any appropriate shapes as long as the first and second electrodes 1 and 3 are disposed on the opposite surfaces.

Each of the first and second electrodes includes an electroconductive layer having a thickness in the range of about 5 nm to 20 μm. The material of the first and second electrodes, which is not particularly limited, may be any material that is generally used for a piezoelectric element. Examples of such a material include a metal, such as Ti, Pt, Ta, Ir, Sr, In, Sn, Au, Al, Fe, Cr, Ni, Pd, Ag, and Cu; and compounds of any of these metals. Each of the first and second electrodes may include one of these materials or may include two or more layers made of these materials. The materials of the first electrode and the second electrode may differ from each other. For example, the material of the electrodes may be Ag, which is advantageous for mass production and cost reduction. When the electrodes are made of Ag, the thickness is, for example, in the range of 1 μm to 10 μm.

The piezoelectric ceramic of the piezoelectric material portion 2 includes a perovskite-type metal oxide that includes barium titanate and Mn.

In the present invention, the term "perovskite-type structure" refers to a crystal structure that is ideally a cubic system, which is described in Iwanami Dictionary of Physics and Chemistry, 5th ed. (published by Iwanami Shoten on Feb. 20, 1998). In general, a metal oxide having a perovskite structure is represented by a chemical formula $ABO_3$. In a metal oxide having a perovskite structure, elements A and B, which are in ionic forms, respectively occupy specific positions in a unit cell, which are called A site and B site. For example, in a unit cell of a cubic system, element A is located at a vertex of the cube, and element B is located at the body-center. Element O, which is an oxygen anion, occupies a face-center of the cube. As a result, barium titanate having a perovskite structure is represented by a chemical formula $BaTiO_3$. The metal oxide having a perovskite structure, which is represented by the chemical formula $ABO_3$, includes three oxygen atoms per unit cell. However, there may be a deviation of several percent, as long as the compound can have piezoelectricity.

Whether the piezoelectric ceramic has a perovskite structure can be determined by performing, for example, X-ray diffraction analysis or electron beam diffraction analysis. If the coordinates of element A, element B, and oxygen shift slightly from those of their specific positions in a unit cell, the unit cell of the perovskite structure deforms and the crystal system becomes a tetragonal system, a rhombohedral system, or an orthorhombic system. The crystal system of the perovskite-type metal oxide may be a tetragonal system at room temperature, with which the piezoelectric ceramic can have an appropriate electromechanical coupling factor.

Because the piezoelectric ceramic includes Mn, the piezoelectric ceramic has an improved mechanical quality factor Qm at room temperature. The mechanical quality factor Qm, which represents the elastic loss due to vibration, is a factor for evaluating the piezoelectric ceramic as a piezoelectric vibrator. The magnitude of the mechanical quality factor Qm is observed as the sharpness of a resonance curve in impedance measurement. In other words, the mechanical quality factor Qm is a constant that represents the sharpness of resonance of a piezoelectric vibrator. When the piezoelectric ceramic is driven as a piezoelectric element at a frequency near a resonant frequency, a displacement that is proportional to the magnitude of the mechanical quality factor Qm can be obtained.

The Mn content is 0.04 parts by weight or more and 0.50 parts by weight or less, and preferably, 0.10 parts by weight or more and 0.36 parts by weight or less with respect to 100 parts by weight of the main component in terms of metal. Here, an accessory content "in terms of metal" refers to the weight of the accessory with respect to the sum of weights (which is regarded as 100) of elements included in a metal oxide (the main component represented by the chemical formula described above), in terms of oxide, which are obtained from the metal contents of the piezoelectric ceramic measured by performing X-ray fluorescence analysis (XRF), ICP emission spectroscopy, atomic absorption spectroscopy, or the like.

When the Mn content is in the above range, a sufficient displacement can be obtained. If the Mn content is less than 0.04 parts by weight, the mechanical quality factor Qm at room temperature might be less than 400. With a piezoelectric element having a mechanical quality factor Qm of less than 400 at room temperature, a sufficient displacement cannot be obtained even at a frequency near a resonant frequency. As a result, a high input voltage is needed to drive the piezoelectric element, and the driving electric power might increase. On the other hand, if the Mn content is more than 0.50 parts by weight, the electromechanical coupling factor $k_{31}$ of the piezoelectric ceramic is low. Also in this case, a high input voltage is needed to drive the piezoelectric element, and the power consumption (the driving electric power described below) might increase. Preferably, the mechanical quality factor Qm is 800 or more, in which case the power consumption does not increase. More preferably, the mechanical quality factor Qm is 1200 or more.

In the present specification, the term "power consumption" refers to electric power consumed by a piezoelectric element, which is the sum of electric power consumed to drive the piezoelectric element and electric power consumed in proportion to the capacitance of the piezoelectric element. Hereinafter, electric power consumed to drive the piezoelectric element will be referred to as "driving electric power", and electric power consumed in proportion to the capacitance of the piezoelectric element will be referred to as "capacitance electric power". The driving electric power tends to decrease as the electromechanical coupling factor $k_{31}$ or the mechanical quality factor Qm of the piezoelectric ceramic increases. On the other hand, the capacitance electric power tends to decrease as the relative permittivity $\epsilon r$ of the piezoelectric ceramic decreases or as the electromechanical coupling factor $k_{31}$ of the piezoelectric ceramic increases.

The power consumption of the piezoelectric element can be measured by using a powermeter. The capacitance electric power (CW) is proportional to the product of the capacitance C of the piezoelectric element, the drive frequency (f), the applied voltage (V), and $2\pi$ ($CW=2\pi \times C \times f \times V$). The driving electric power can be obtained by subtracting the capacitance electric power from the reading of the powermeter.

The relative permittivity $\epsilon r$ of the piezoelectric element can be calculated from the capacitance of the piezoelectric element, which can be obtained by using an impedance analyzer or an LCR meter.

The electromechanical coupling factor $k_{31}$ and the mechanical quality factor Qm of the piezoelectric element can be calculated on the basis of a Japan Electronics and Information Technology Industries Association standard (JEITA EM-4501) from the resonant frequency and the antiresonant frequency of the piezoelectric element, which can be measured by using an impedance analyzer. Hereinafter, this method will be referred to as a "resonance-antiresonance method".

The piezoelectric ceramic included in the piezoelectric element according to the present invention has residual polarization.

The term "residual polarization" refers to polarization that remains in the piezoelectric ceramic when an external electric field is not applied to the piezoelectric ceramic. When a piezoelectric ceramic is polarized, the directions of spontaneous polarization are aligned in the piezoelectric ceramic, and residual polarization occurs. Whether or not the piezoelectric ceramic has residual polarization can be detected by applying a voltage to the piezoelectric ceramic and measuring the relationship between the applied electric field E and the polarization P (P-E hysteresis curve).

The piezoelectric element according to the present invention has a measurement surface extending in a direction crossing the direction of residual polarization of the piezoelectric ceramic, and, after the measurement surface has been polished to have a surface roughness of 200 nm or less, the measurement surface has a (002)/(200) X-ray diffraction intensity ratio of 1.0 or more at room temperature. Preferably, the (002)/(200) diffraction intensity ratio is 1.03 or more, and more preferably 1.08 or more.

Figure 2:
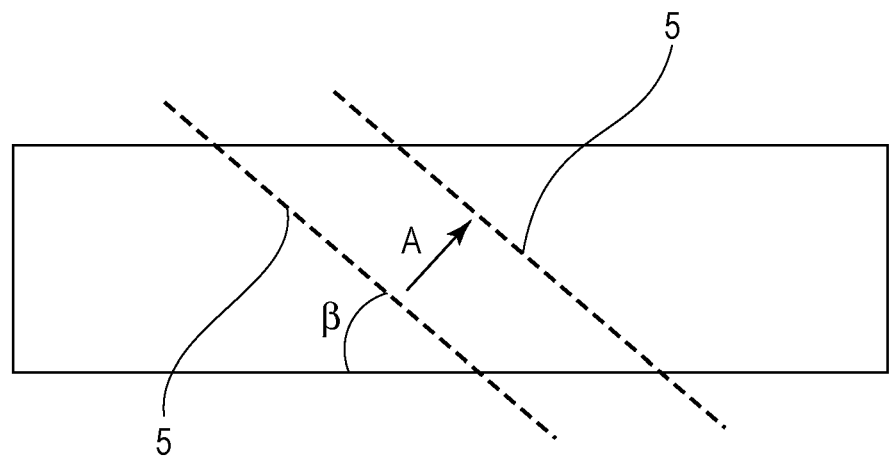
FIG. 2 is schematic view illustrating a method of identifying the direction of residual polarization of a piezoelectric element according to the present invention.

The direction of residual polarization can be identified as by using the following method. FIG. 2 illustrates the method, in which the direction of residual polarization is indicated by arrow A. First, a piezoelectric ceramic that has been polarized is cut at an appropriate angle $\beta$ (where $\beta$ is a multiple of 10° that satisfies $0° \leq \beta < 360°$), electrodes are formed on both of cut surfaces 5, and the piezoelectric constant is measured. The relationship between the piezoelectric constant and $\beta$ can be examined by repeatedly performing the measurement.

Then, the direction of residual polarization can be identified as ($\beta+90°$), where $\beta$ is an angle at which the piezoelectric constant is the maximum. Note that the angle $\beta$, at which the piezoelectric constant is the maximum, may have an error of ±10° with consideration of a cutting error and a measurement error. The measurement of the piezoelectric constant can be easily performed by using a $d_{33}$ meter.

The direction of residual polarization of a piezoelectric element on which an electrode is formed can be identified as follows: first, the piezoelectric constant of the piezoelectric element is measured; surface treatment or the like is performed; and the piezoelectric constants in different directions are measured. If decrease of the piezoelectric constant is observed in a plurality of different directions, the direction of a normal line of a surface on which the electrode is formed may be regarded as the direction of residual polarization. Also in this case, the angle may have an error of ±10° with consideration of a cutting error and a measurement error.

Accordingly, by identifying the direction of residual polarization using the method described above, it is possible to determine a surface extending in a direction crossing the direction of the residual polarization of the piezoelectric ceramic. In other words, in the piezoelectric element shown in FIG. 1, which is shaped like a rectangular-parallelepiped, a surface extending in a direction crossing the direction of the residual polarization is a surface that is in contact with the first electrode 1 or the second electrode 3 of the piezoelectric material portion 2. Hereinafter, this surface will be referred to as a "measurement surface 4".

The piezoelectric ceramic of the piezoelectric element according to the present invention, whose main component is barium titanate having a perovskite structure, has a Young's modulus higher than that of PZT. Therefore, when the piezoelectric ceramic is subjected to machining, such as polishing, grinding, shaving, cutting, a processing strain (also called a dislocation) tends to occur in a part of the piezoelectric ceramic near a surface thereof. In the present specification, a layer having a processing strain is defined as a "surface layer". The thickness of the surface layer, which depends on the composition of the piezoelectric ceramic, is in the range of about 1 μm to 10 μm. The penetration depth of X-rays emitted by a general X-ray diffraction apparatus, which is used to analyze the crystal structure of a piezoelectric ceramic, is only about 10 μm. Therefore, information that can be obtained by measuring the measurement surface is mainly information about the surface layer. A piezoelectric ceramic whose thickness in the electric field application direction is 100 μm or less is not used due to a low yield in machining. A piezoelectric ceramic whose thickness in the electric field application direction is 10 mm or more are not used due to a high voltage needed for polarization. Therefore, the percentage of the surface layer in the piezoelectric ceramic is in the range of 0.1% to 20%, and parts of the piezoelectric ceramic other than the surface layer determine most of the characteristics of the piezoelectric ceramic. Accordingly, in order to accurately evaluate the crystal structure of a piezoelectric ceramic mainly composed of barium titanate having a perovskite structure, it is necessary to evaluate parts of the piezoelectric ceramic other than the surface layer, which determine the characteristic of the piezoelectric ceramic. In order to do so, it is necessary to polish the surface layer on the measurement surface. To be specific, it is necessary to polish the measurement surface so that the surface roughness becomes 200 nm or less. The polishing method is not particularly limited. A finishing step of polishing is performed, for example, by buffing using a colloidal silica. By being buffed, the surface can have a surface roughness of 200 nm or less. In this case, the surface layer is removed by a thickness of, for example, 10 μm or more. The surface roughness can be measured by using a stylus instrument (JIS B 0651: 2001). In the present specification, the term "surface roughness" refers to the arithmetic average roughness Ra.

In the piezoelectric element according to the present invention, the (002)/(200) X-ray diffraction intensity ratio of a measurement surface of the piezoelectric ceramic at room temperature is 1.0 or more, preferably 1.03 or more, and more preferably 1.08 or more, because, in these cases, the piezoelectric ceramic has an appropriate electromechanical coupling factor $k_{31}$. Therefore, the driving electric power of the piezoelectric element including the piezoelectric ceramic can be reduced. Here, the term "the (002)/(200) diffraction intensity ratio" refers to the ratio of the maximum intensity of a diffraction peak due to 002 plane of a crystal to the maximum intensity of a diffraction peak due to 200 plane of the crystal in pseudo-cubic system representation obtained by using a 2θ-θ method. The positions of the diffraction peaks due to 002 plane and 200 plane can be identified by using the result of X-ray diffraction measurement of the piezoelectric ceramic and data on barium titanate presented in known documents (see, for example, No. 05-0626 of PDF-2 of The International Centre for Diffraction Data (ICDD)). If the (002)/(200) X-ray diffraction intensity ratio of a piezoelectric ceramic is 1.0 or more, there are more c-domains than a-domains in crystal grains of the piezoelectric ceramic when observed in a direction from the measurement surface. In this case, the piezoelectric ceramic has a good electromechanical coupling factor $k_{31}$ in a direction perpendicular to the direction in which an electric field is applied. If the (002)/(200) X-ray diffraction intensity ratio of the measurement surface is less than 1.0, there are more a-domains than c-domains when observed in a direction from the measurement surface. In this case, the electromechanical coupling factor $k_{31}$ in the direction perpendicular to the direction in which an electric field is applied is low. Here, the term "domain" refers to a region in which the directions of spontaneous polarization are aligned. In the present specification, the term "room temperature" refers to 25° C. However, a temperature range of 20° C. to 30° C., in which features and advantages of the present invention do not differ from those at room temperature, is included in the meaning of "room temperature" in the present invention.

Figure 4:
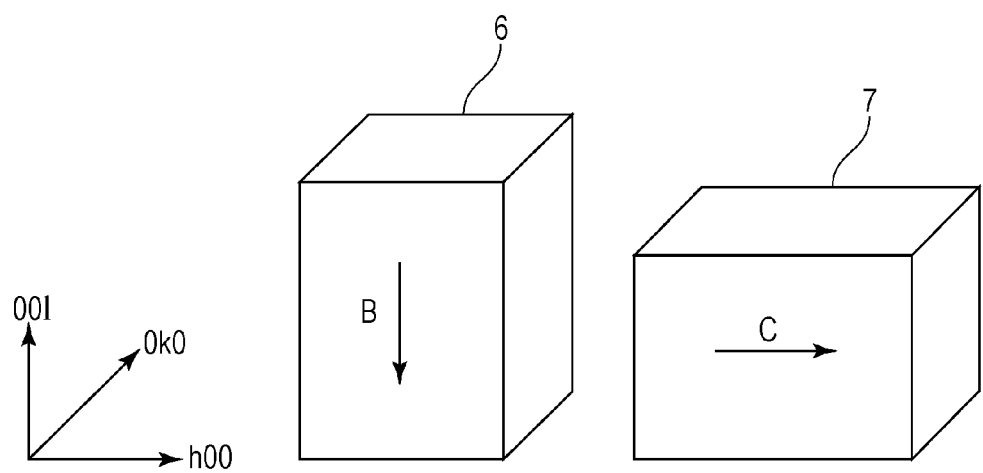
FIG. 4 is a conceptual diagram illustrating an a-domain and a c-domain of a crystal grain of a piezoelectric ceramic of a piezoelectric element according to the present invention.

FIG. 4 is a schematic view of an a-domain 7 and a c-domain 6 of a piezoelectric ceramic having a tetragonal crystal system, in which arrows B and C indicate the directions of spontaneous polarization. The term "a-domain" refers to a domain of a tetragonal system having spontaneous polarization in [h00] direction and [0k0] direction and directions opposite to these directions. The term "c-domain" refers to a domain of a cubic system having spontaneous polarization in [001] direction and a direction opposite to this direction. Because the axis of spontaneous polarization of barium titanate having a tetragonal system is a c-axis, if there are more c-domains than a-domains when observed in a direction from the measurement surface, the piezoelectric ceramic can have a good electromechanical coupling factor $k_{31}$.

The conditions for measuring the X-ray diffraction are not particularly limited. For example, a general method, such as a 2θ-θ method using a parallel beam method, can be used. Typical measurement conditions are as follows.

Figure 3:
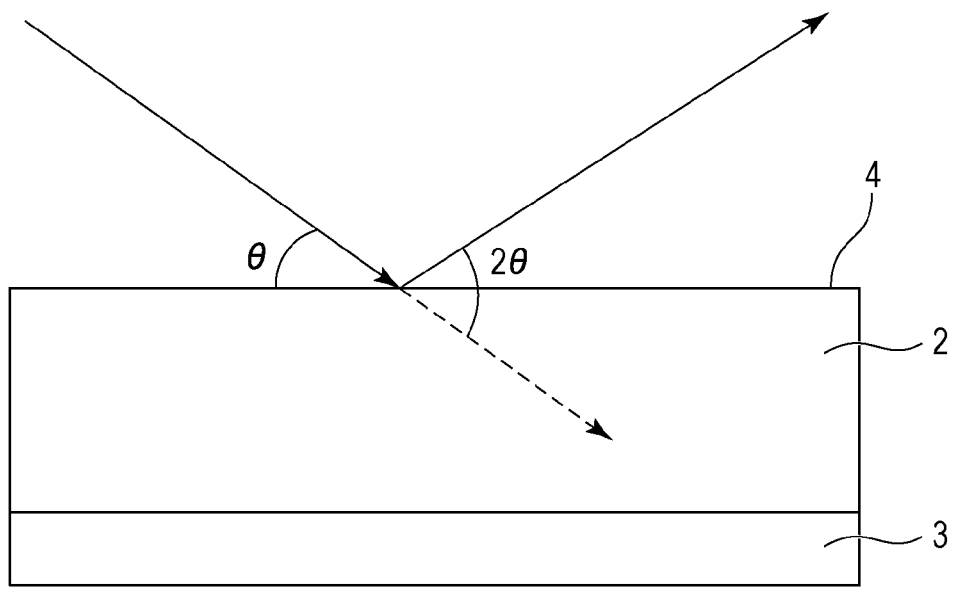
FIG. 3 is a schematic view illustrating a method of measuring X-ray diffraction of a piezoelectric element according to the present invention.

A Cu-Kα tube is used as an X-ray source, the tube voltage is 45 kV, and the tube current is 40 mA. A 2θ measurement range of 20° to 50° is used so that information on 002 plane and 200 plane can be obtained. An appropriate spot diameter of incident beam depends on the area of the measurement surface. For example, the spot may have a diameter with which incident beam is incident on the entirety of the measurement surface. A sufficient intensity can be obtained if the scanning speed is in the range of 0.10 degrees/minute to 1.00 degrees/minute and the sampling interval is in the range of 0.001 degrees to 0.020 degrees. In this case, reproducible data can be obtained. FIG. 3 is a schematic view illustrating a method of measuring X-ray diffraction of the piezoelectric element according to the present invention, in which the relationship between θ and 2θ is shown. When using a multi-axis X-ray diffraction meter, it is necessary to perform measurement in a state in which the angle ψ between the measurement surface and the normal line of incident beam is 0°.

In the piezoelectric element according to the present invention, the ratio c/a of a c-axis lattice constant c to an a-axis lattice constant a of the piezoelectric ceramic at room temperature is in the range of 1.004 ≤c/a≤1.010.

When the ratio c/a at room temperature is in this range, the piezoelectric ceramic has a good electromechanical coupling factor $k_{31}$. Therefore, with the piezoelectric element including the piezoelectric ceramic, the driving electric power can be reduced. If the ratio c/a is less than 1.004, the piezoelectric ceramic has a crystal structure that is similar to a cubic system. Therefore, in this case, the electromechanical coupling factor $k_{31}$ at room temperature is low, the input voltage needed to drive the piezoelectric element is high, and the driving electric power is large. If the ratio c/a is greater than 1.010, the voltage needed for polarization is increased.

The lattice constants a and c of a piezoelectric ceramic can be calculated from interplanar spacing obtained by using a 2θ–θ method. Let λ denote the wavelength of X-rays, $d_{(200)}$ denote the interplanar spacing of 200 plane, $\theta_{200}$ denote an angle of 200 plane at which the intensity of a diffraction peak is the maximum, $d_{(002)}$ denote the interplanar spacing of 002 plane, and $\theta_{002}$ denote an angle of 002 plane at which the intensity of a diffraction peak is the maximum. Then, the lattice constants a and c can be represented by the following expressions. Note that these crystal planes are those of pseudo-cubic system representation.

$$d_{(200)} = \frac{\lambda}{2\sin\theta_{200}}$$

$$d_{(002)} = \frac{\lambda}{2\sin\theta_{002}}$$

$$a = 2 \cdot d_{(200)}$$

$$a = 2 \cdot d_{(002)}$$

The crystal system of the piezoelectric ceramic may be a tetragonal system, with which the piezoelectric ceramic can have a good electromechanical coupling factor $k_{31}$.

The half-width of a (002) diffraction peak of the piezoelectric ceramic at room temperature is 1.2° or less.

The term "half-width" refers to a width $(\theta_2 - \theta_1)$, where $\theta_1$ and $\theta_2$ are angles at which diffraction intensity is P/2 where P is the maximum intensity $(\theta_2 > \theta_1)$. A half-width is also called a full width at half maximum. Note that it is necessary to subtract a background value from the magnitude of the maximum intensity.

If the half-width of the (002) diffraction peak of the piezoelectric ceramic at room temperature is 1.2° or less, a sufficient electromechanical coupling factor $k_{31}$ can be obtained. If the half-width of the (002) diffraction peak is greater than 1.2°, the crystallinity is insufficient and a sufficient electromechanical coupling factor $k_{31}$ cannot be obtained.

The piezoelectric ceramic of the piezoelectric element according to the present invention may further include Bi.

When the piezoelectric ceramic includes Bi, the relative density of the piezoelectric ceramic is improved. The Bi content may be 0.04 parts by weight or more and 0.80 parts by weight or less with respect to 100 parts by weight of the perovskite-type metal oxide in terms of metal. If the Bi content is less than 0.04 parts by weight, the relative density of the piezoelectric ceramic does not improve as compared with a ceramic that does not include Bi. If the Bi content is 0.80 parts by weight or more, the electromechanical coupling factor $k_{31}$ at room temperature decreases, the input voltage needed to drive the piezoelectric element increases, and, as a result, the driving electric power might increase.

In the piezoelectric element according to the present invention, the perovskite-type metal oxide may be represented by the following general formula (1):

$$(Ba_{1-x}Ca_x)_\alpha(Ti_{1-y}Zr_y)O_3 \qquad (1),$$

where $0.125 \le x \le 0.300$, $0.041 \le y \le 0.080$, and $0.986 \le \alpha \le 1.020$.

When x, y, and α are within the above ranges, the piezoelectric ceramic can have a higher electromechanical coupling factor $k_{31}$ at room temperature.

A metal oxide represented by the general formula (1) has metal elements Ba and Ca at A sites and metal elements Ti and Zr at B sites. However, some of Ba and Ca may be located at B sites. Likewise, some of Ti and Zr may be located at A sites. In the general formula (1), the mole ratio of elements at B sites to oxygen is 1 to 3. However, a mole ratio that is slightly different from this value is included in the range according to the present invention, as long as the metal oxide has a perovskite structure as a main phase.

In the general formula (1) of the piezoelectric ceramic, the value of x, which represents the mole ratio of Ca at A site, may be in the range of $0.125 \le x \le 0.300$. If x is less than 0.125, the relative permittivity εr of the piezoelectric ceramic at room temperature is high, and the capacitance electric power of the piezoelectric element might increase. If x is greater than 0.300, the electromechanical coupling factor of the piezoelectric ceramic $k_{31}$ is low, the input voltage needed to drive the piezoelectric element is high, and, as a result, the driving electric power might increase. Preferably, x is in the range of $0.125 \le x \le 0.190$.

In the general formula (1), the value of y, which represents the mole ratio of Zr at B site, may be in the range of $0.041 \le y \le 0.080$. If y is greater than 0.080, the relative permittivity εr of the piezoelectric ceramic at room temperature is high, and the capacitance electric power of the piezoelectric element might increase. If y is smaller than 0.041, the electromechanical coupling factor $k_{31}$ of the piezoelectric ceramic at room temperature is low, the input voltage needed to drive the piezoelectric element is high, and, as a result, the driving electric power might increase. Preferably, y is in the range of $0.050 \le y \le 0.080$.

In the general formula (1), the value of α, which is the ratio of the number of moles of Ba and Ca at A sites to the number of moles of Ti and Zr at B sites, may be in the range of $0.986 \le \alpha \le 1.020$. If α is less than 0.986, crystal grains of the piezoelectric ceramic are likely to grow abnormally, and the mechanical strength of the material might decrease. If α is greater than 1.020, crystal grains can grow only at an excessively high temperature, so that it might happen that sintering cannot be performed by using a general firing furnaces. Here, a state in which "sintering cannot be performed" refers to a state in which the density of the piezoelectric ceramic does not become sufficient or a state in which the piezoelectric ceramic has a large number of pores and defects therein. Preferably, α is in the range of $1.001 \le \alpha \le 1.016$.

Let A denote the sum of the number of moles of Ba and Ca, and B denote the sum of the number of moles of Ti, Zr, and Mn. The ratio A/B may be in the range of $0.993 \le A/B \le 0.998$. When the ratio A/B is in this range, the piezoelectric ceramic has a particularly good electromechanical coupling factor $k_{31}$ and mechanical quality factor Qm, and therefore the piezoelectric element according to the present invention can be driven with low electric power.

In the piezoelectric element according to the present invention, the electromechanical coupling factor $k_{31}$ of the piezoelectric ceramic at room temperature measured by using the first electrode and the second electrode may be 0.200 or more. If the electromechanical coupling factor $k_{31}$ at room temperature is 0.200 or more, an input voltage needed to drive the piezoelectric element can be reduced, and therefore the driving electric power can be reduced.

If the electromechanical coupling factor $k_{31}$ at room temperature is less than 0.200, the input voltage needed to drive the piezoelectric element increases, and, as a result, the driving electric power might increase.

In the piezoelectric element according to the present invention, the relative permittivity εr of the piezoelectric ceramic at room temperature measured by using the first electrode and the second electrode may be 2500 or less.

If the relative permittivity at room temperature is greater than 2500, the capacitance electric power of the piezoelectric element might increase.

The average equivalent circle diameter of crystal grains of the piezoelectric ceramic may be 0.5 μm or more and 10 μm or less. The term "average equivalent circle diameter" refers to the average of the equivalent circle diameters of a plurality of crystal grains. If the average equivalent circle diameter of crystal grains is in this range, the piezoelectric ceramic can have an appropriate electromechanical coupling factor $k_{31}$ and an appropriate mechanical strength. If average equivalent circle diameter is less than 0.5 μm, the piezoelectric characteristic might not be sufficient. If the average equivalent circle diameter is greater than 10 μm, the mechanical strength might decrease. Preferably, the range of the average equivalent circle diameter is in the range of 2.5 μm or more and 9.0 μm or less.

In the present invention, the term "equivalent circle diameter" refers to the diameter of a circle having an area the same as the projected area of a crystal grain, which corresponds to "projection-area equivalent circle diameter" generally used in microscopy. In the present invention, a method of measuring the equivalent circle diameter is not particularly limited. For example, the equivalent circle diameter can be obtained by image-processing a photographic image of a surface of a piezoelectric ceramic, which can be captured by using a polarizing microscope or a scanning electron microscope. Because the optimal magnification differs depending on grain size to be measured, an optical microscope and an electron microscope may be selectively used in accordance with the grain size.

The relative density of the piezoelectric ceramic may 93% or more and 100% or less. The term "relative density" refers to the ratio of the theoretical density to the actually measured density of the piezoelectric ceramic. The theoretical density is calculated from the lattice constant of the piezoelectric ceramic and the atomic weights of component elements. The lattice constant can be measured, for example, by X-ray diffraction analysis. The density can be measured, for example, by using Archimedes' method.

If the relative density is smaller than 93%, the electromechanical coupling factor $k_{31}$ or the mechanical quality factor Qm may be insufficient, or the mechanical strength might decrease.

Preferably, the relative density of the piezoelectric ceramic is in the range of 95% or more and 100% or less, and more preferably, in the range of 97% or more and 100% or less.

A method for manufacturing a piezoelectric element according to the present invention is not particularly limited. An example of the method will be described below.

First, a piezoelectric ceramic to be used as the piezoelectric material portion 2 is manufactured. The process of manufacturing the piezoelectric ceramic at least includes a step of making a compact from powder materials and a step of sintering the compact.

The step of making a compact from the powder materials is not particularly limited. A general method may be used, which includes a step of making a compact from solid powder of an oxide, a carbonate, a nitrate, or an oxalate including component elements; and a step of sintering the compact at room temperature. The powder materials may include metal compounds, such as a Ba compound, a Ca compound, a Ti compound, a Zr compound, a Mn compound, and a Bi compound.

Examples of a Ba compound that can be used include barium oxide, barium carbonate, barium oxalate, barium acetate, barium nitrate, barium titanate, barium zirconate, barium stannate, and barium titanium zirconate.

Examples of a Ca compound that can be used include calcium oxide, calcium carbonate, calcium oxalate, calcium acetate, calcium titanate, calcium zirconate, and calcium stannate.

Examples of a Ti compound that can be used include titanium oxide, barium titanate, barium titanate zirconate, and calcium titanate.

Examples of a Zr compound that can be used include zirconium oxide, barium zirconate, barium titanate zirconate, and calcium zirconate.

Examples of a Mn compound that can be used include manganese carbonate, manganese oxide, manganese dioxide, manganese acetate, and trimanganese tetraoxide.

Examples of a Bi compound that can be used include bismuth oxide and lithium bismuthate.

A material used to adjust the value of a, which is the ratio of number of moles of Ba and Ca at A sites to the number of moles of Ti and Zr at B sites of the piezoelectric ceramic, is not particularly limited. The same effect can be obtained by using any of the Ba compounds, the Ca compounds, the Ti compounds, and the Zr compounds described above.

The term "compact" refers to a solid body formed by compressing the solid powder. Examples of the method of forming a compact include uniaxial pressing, cold isostatic pressing, hot isostatic pressing, casting, and extrusion. Granulated powder may be used when making a compact. By sintering a compact made from granulated powder, a sintered body including crystal grains whose sizes are uniformly distributed can be easily obtained.

The method of granulating a powder material of a piezoelectric ceramic is not particularly limited. A spray drying method, with which the particle diameter of granulated powder uniform can be made more uniform, may be used as a granulation method.

Examples of a binder that can be used when performing granulation includes PVA (polyvinyl alcohol), PVB (polyvinyl butyral), and acrylic plastics. The amount of binder to be added is in the range of 1 part by weight to 10 parts by weight with respect to 100 parts by weight of the powder material of the piezoelectric material. Preferably, the amount of binder is in the range of 2 parts by weight to 5 parts by weight, so that the density of a compact can be increased.

The step of sintering the compact is not particularly limited.

Examples of a sintering method include sintering using an electric furnace, sintering using a gas furnace, electric current assisted sintering, microwave sintering, millimeter wave sintering, and hot isostatic press (HIP). An electric furnace or a gas furnace used for sintering may be a continuous furnace or a batch furnace.

The sintering temperature in the sintering method is not particularly limited. For example, the sintering temperature may be a temperature at which chemical reactions of compounds occur and crystal growth sufficiently occurs. Preferably, the sinter temperature is 1100° C. or more and 1400° C. or less, and more preferably, 1100° C. or more and 1350° C. or less, in order to make the grain size be in the range of 1.5 μm to 10 μm. In order to reproducibly stabilize the characteristics of a piezoelectric material obtained by sintering, sintering may be performed for a period that is 2 hours or longer and 48 hours or shorter while maintaining a constant temperature in the above range. A two-step sintering method or the like may be used. In consideration of productivity, a sintering method that does not cause a sharp change in temperature may be used.

After having been sintered, the piezoelectric ceramic may be heat-treated in a temperature range having a highest temperature in the range of 700° C. to 900° C. By being heat-treated, the piezoelectric ceramic can be polarized with an electric field of 0.8 kV/mm or less.

Next, the first electrode 1 and the second electrode 3 are formed. A method of forming the first electrode 1 and the second electrode 3 is not particularly limited. The first electrode 1 and the second electrode 3 are formed on surfaces of the piezoelectric material portion 2 facing each other. The first electrode 1 and the second electrode 3 each may be formed by applying and baking a metal paste, by sputtering, or by deposition. The first electrode 1 and the second electrode 3 each may be patterned in an appropriate shape. When using Ag, the electrodes may be formed by applying and baking an Ag paste. Preferably, an Ag paste is applied to a surface of the piezoelectric ceramic in which the piezoelectric material portion 2 is to be formed, the piezoelectric ceramic and the Ag paste are heat-treated together in a temperature range having the highest temperature in the range of 700° C. to 900° C., and the Ag paste may be baked for about five minutes. Further preferably, cooling is performed at a rate of 100° C./h or more. By being baked under these conditions, an Ag electrode can have sufficient electrical conductivity stably. Moreover, because the piezoelectric ceramic of the piezoelectric material portion are heat-treated, the (002)/(200) X-ray diffraction intensity ratio of a measurement surface can be made to be 1.0 or more easily. Performing heat-treatment at a temperature of 1000° C. or higher is to be avoided, because, in this case, the composition of the piezoelectric ceramic might be change by the heat treatment. Cooling may be performed at a rate of 1000° C./h or less. This is because cooling at an excessively high rate might cause negative effects, such as a crack in the ceramic.

Lastly, a polarizing step of applying a direct-current voltage to the first electrode 1 and the second electrode 3 is performed. The polarizing step is not particularly limited, and may be performed in the atmosphere or in a silicone oil. The polarizing step may be performed in the atmosphere in view of the mass productivity. The polarizing step may be performed by applying an electric field in the range of 5 kV/cm to 14 kV/cm for 10 to 30 minutes in a temperature range having the highest temperature in the range of 90° C. to 150° C. A voltage may be continuously applied when cooling from the highest temperature is performed. By continuously applying a voltage in the cooling process, the (002)/(200) X-ray diffraction intensity ratio of a measurement surface can be easily made to be 1.0 or more. In order to increase of the electromechanical coupling factor $k_{31}$, cooling may be performed at a rate of 100° C./or less in the cooling process. Cooling may be performed at a rate of 1000° C./h or less. This is because, cooling at an excessively high rate might cause negative effects, such as a crack in the ceramic.

Liquid Ejection Head

Next, a liquid ejection head according to the present invention will be described.

The liquid ejection head according to the present invention includes a liquid chamber, which is provided with a vibration unit including the piezoelectric element, and an ejection port connected to the liquid chamber.

Figure 5A:
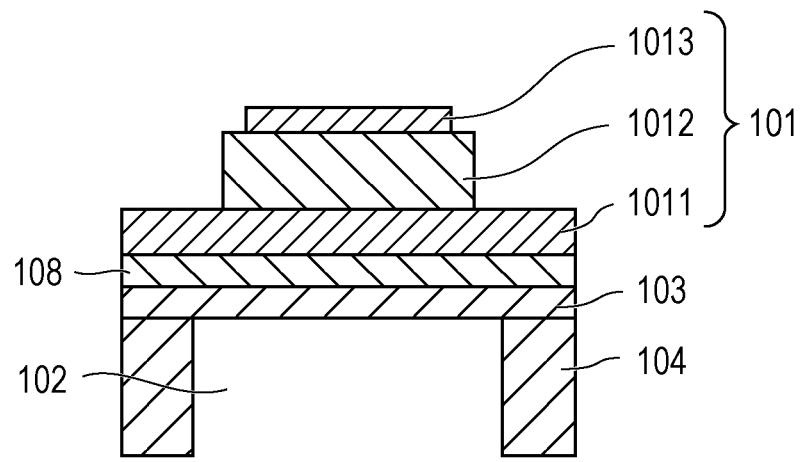
FIGS. 5A and 5B are schematic views illustrating a liquid ejection head according to an embodiment of the present invention.
Figure 5B:
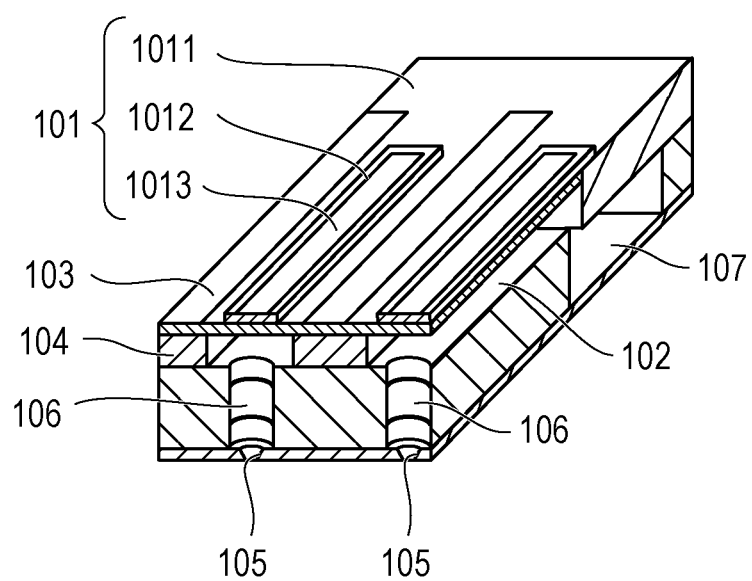

FIGS. 5A and 5B are schematic views illustrating a liquid ejection head according to an embodiment of the present invention. As illustrated in FIGS. 5A and 5B, the liquid ejection head according to the present invention includes a piezoelectric element 101 according to the present invention. The piezoelectric element 101 includes a first electrode 1011, a piezoelectric ceramic 1012, and a second electrode 1013. As illustrated in FIG. 5B, the piezoelectric ceramic 1012 is patterned as necessary.

FIG. 5B is a schematic view of the liquid ejection head. The liquid ejection head includes an ejection port 105, an individual liquid chamber 102, a connection hole 106 connecting the individual liquid chamber 102 to the ejection port 105, a liquid chamber partition wall 104, a common liquid chamber 107, a diaphragm 103, and the piezoelectric element 101. In FIG. 5B, the piezoelectric element 101 has a rectangular shape. Alternatively, the piezoelectric element 101 may have a non-rectangular shape, such as an elliptical shape, a circular shape, or a parallelogrammic shape. In general, the piezoelectric ceramic 1012 has a shape adapted to that of the individual liquid chamber 102.

Referring to FIG. 5A, a part of the liquid ejection head according to the present invention near the piezoelectric element 101 will be described in detail. FIG. 5A is a cross-sectional view of the piezoelectric element illustrated in FIG. 5B. In FIG. 5A, the piezoelectric element 101 has a rectangular cross-sectional shape. Alternatively the cross-sectional shape may be trapezoidal or inverted trapezoidal.

In FIG. 5A, the first electrode 1011 is used as a lower electrode, and the second electrode 1013 is used as an upper electrode. However, the disposition of the first electrode 1011 and the second electrode 1013 is not limited to this. For example, the first electrode 1011 may be used as a lower electrode or an upper electrode. Likewise, the second electrode 1013 may be used as an upper electrode or a lower electrode. There may be a buffer layer 108 between the diaphragm 103 and the lower electrode. The names of these elements depend on the method for manufacturing the device, and the advantages of the present invention can be obtained in any of these cases.

In the liquid ejection head, the diaphragm 103 moves up and down due to extension and contraction of the piezoelectric ceramic 1012, thereby applying a pressure to a liquid in the individual liquid chamber 102. As a result, the liquid is ejected from the ejection port 105. The liquid ejection head according to the present invention can be used for a printer or for manufacturing an electronic device.

The thickness of the diaphragm 103 is 1.0 μm or more and 15 μm or less, and preferably, 1.5 μm or more and 8 μm or less. The material of the diaphragm is not limited and may be Si. The diaphragm may be made of Si that is doped with boron or phosphor. The buffer layer on the diaphragm or an electrode layer may function as a part of the diaphragm. The thickness of the buffer layer 108 is 5 nm or more and 300 nm or less, and preferably, 10 nm or more and 200 nm or less. The equivalent circle diameter of the ejection port 105 is 5 μm or more and 40 μm or less. The shape of the ejection port 105 may be circular, star-shaped, polygonal, or triangular.

Liquid Ejection Apparatus

Next, a liquid ejection apparatus according to the present invention will be described. The liquid ejection apparatus according to the present invention includes a placement portion for placing a transferred object thereon and the liquid ejection head.

Figure 6:
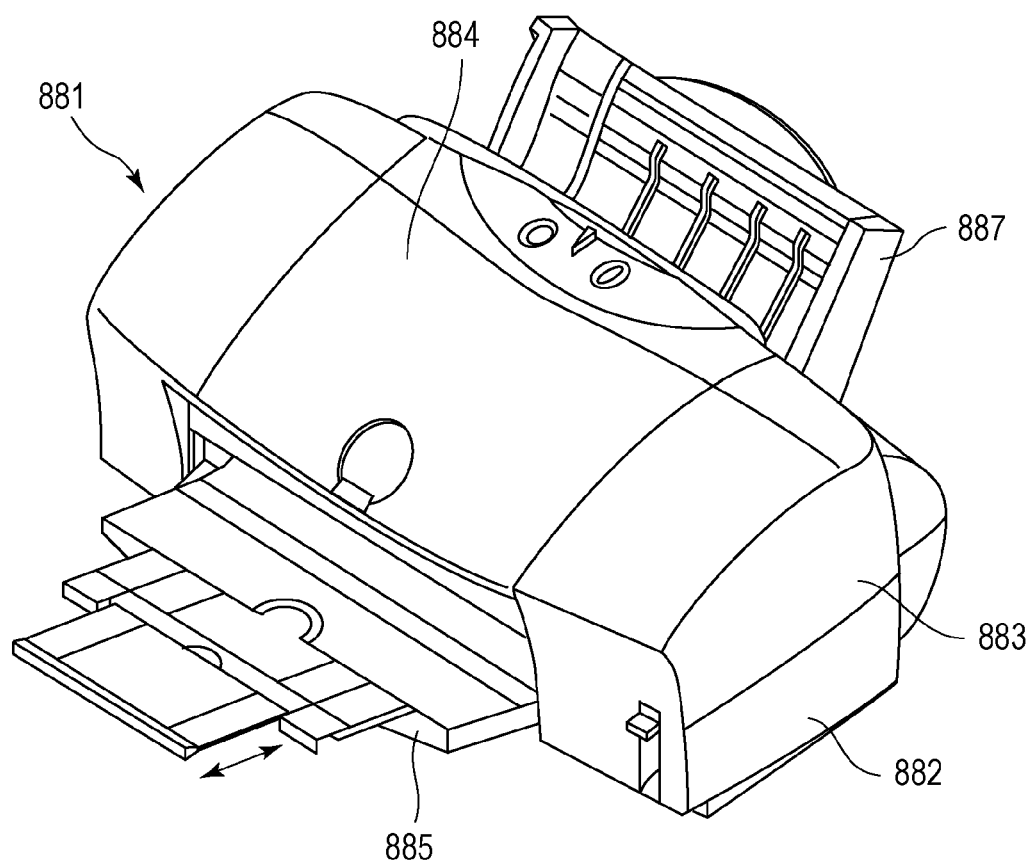
FIG. 6 is a schematic view illustrating a liquid ejection apparatus according an embodiment of the present invention.
Figure 7:
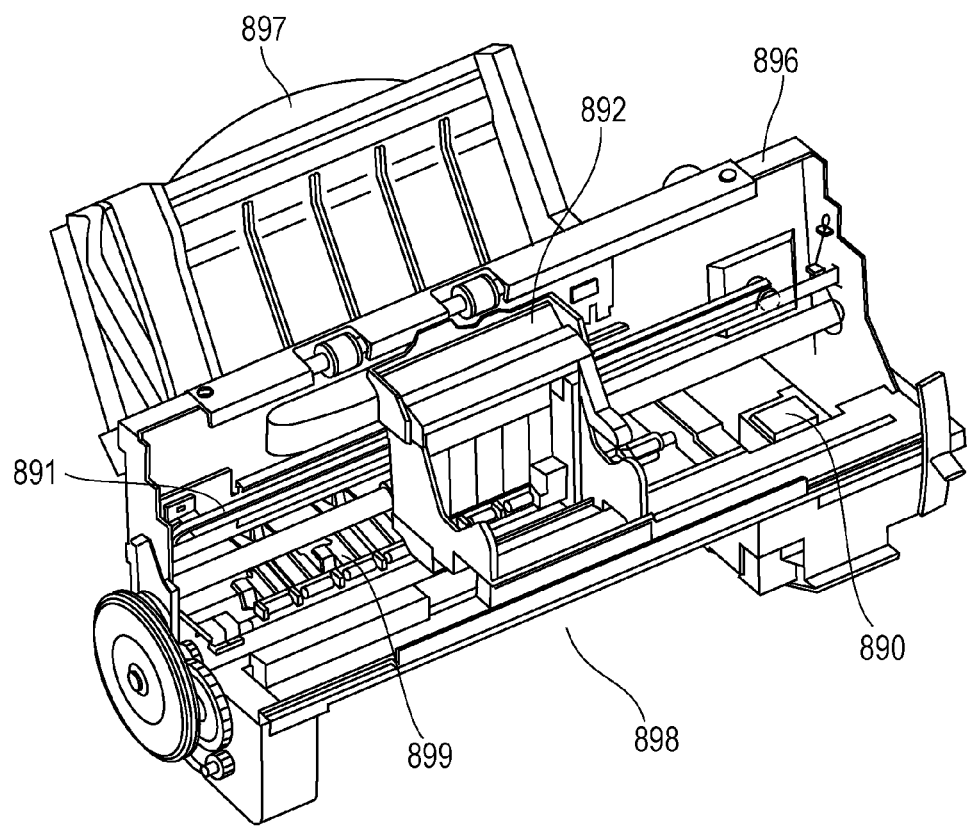
FIG. 7 is a schematic view of the liquid ejection apparatus according to the embodiment of the present invention.

FIGS. 6 and 7 illustrate an inkjet recording apparatus 881, which is an example of the liquid ejection apparatus according to the present invention. FIG. 6 illustrates the inkjet recording apparatus 881 (liquid ejection apparatus), and FIG. 7 illustrates the inkjet recording apparatus 881 in a state in which components 885 and 887 are removed from a housing 882. The inkjet recording apparatus 881 includes an automatic sheet feeder 897 for automatically feeding a recording sheet, which is an example of a transferred object, into an apparatus body 896. The inkjet recording apparatus 881 further includes three components for guiding a recording sheet, which has been fed from the automatic sheet feeder 897, to a predetermined recording position and from the recording position to an output opening 898. To be specific, the inkjet recording apparatus 881 includes a transport unit 899, which is a placement portion for placing a transferred object thereon; a recording unit 891 for performing recording on a recording sheet transported to the recording position; and a recovery unit 890 for performing a recovery operation on the recording unit 891. The recording unit 891 includes a carriage 892 that holds the liquid ejection head according to the present invention and that reciprocates along a rail.

When a computer sends an electric signal to the inkjet recording apparatus, the carriage 892 is moved along the rail and a driving voltage is applied to electrodes sandwiching a piezoelectric ceramic therebetween, and the piezoelectric ceramic becomes displaced. Due to the displacement of the piezoelectric ceramic, the diaphragm 103 shown in FIG. 5B presses the individual liquid chamber 102, and ink is ejected from the ejection port 105 to perform printing.

With the liquid ejection apparatus according to the present invention, liquid can be uniformly ejected at a high speed and the size of the apparatus can be reduced.

The liquid ejection apparatus according to the present invention can be used not only as an inkjet recording apparatus, such as the printer described above, a facsimile, a multifunctional machine, or a copier; but also as a liquid ejection apparatus for industrial use.

In addition, a user can select a desirable transferred object according to a use. The liquid ejection apparatus may have a structure in which the liquid ejection head moves relative to a transferred object placed on a stage serving as the placement portion.

Ultrasonic Motor

Next, an ultrasonic motor according to the present invention will be described. The ultrasonic motor according to the present invention includes a vibration body including the piezoelectric element and a movable body that contacts the vibration body.

Figure 8:
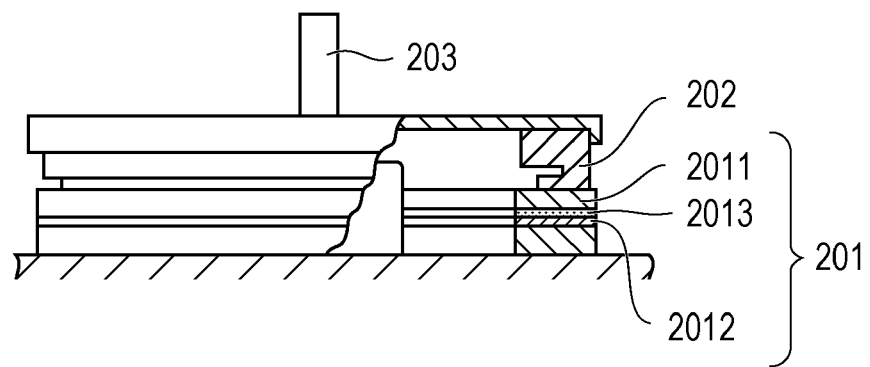
FIG. 8 is a schematic view of an ultrasonic motor according to an embodiment of the present invention.

FIG. 8 is a schematic view of an ultrasonic motor according to an embodiment of the present invention. The ultrasonic motor includes a piezoelectric element according to the present invention, in which a piezoelectric material portion is a single plate made of a piezoelectric ceramic. The ultrasonic motor includes a vibrator 201, a rotor 202 that is in contact with a sliding surface of the vibrator 201 due to a pressure generated by a pressure spring (not shown), and an output shaft 203 that is integrally formed with the rotor 202. The vibrator 201 includes an elastic ring 2011 made of a metal, a piezoelectric element 2012 according to the present invention, and an organic adhesive 2013 (epoxy adhesive, cyanoacrylate adhesive, or the like) that affixes the piezoelectric element 2012 to the elastic ring 2011. The piezoelectric element 2012 according to the present invention includes a piezoelectric ceramic sandwiched between a first electrode and a second electrode, which are not shown.

When a two-phase alternating voltage whose phase is displaced by an odd multiple of n/2 is applied to the piezoelectric element according to the present invention, a flexural progressive wave is generated in the vibrator 201, and points on the sliding surface of the vibrator 201 perform elliptical motions. When the rotor 202 is in pressed contact with the sliding surface of the vibrator 201, the rotor 202 rotates in a direction opposite to that of the flexural progressive wave by receiving a frictional force from the vibrator 201. A driven body (not shown), which is joined to the output shaft 203, is driven by the rotational force of the rotor 202.

When a voltage is applied to a piezoelectric ceramic, the piezoelectric ceramic extends and contracts due to a transversal piezoelectric effect. When an elastic body, such as a metal body, is joined to the piezoelectric element, the elastic body is bent by the extension and contraction of the piezoelectric ceramic. The operation of ultrasonic motor described here is based on this principle.

Optical Device

Next, an optical device according to the present invention will be described. The optical device according to the present invention includes a driving unit including the ultrasonic motor.

Figure 9A:
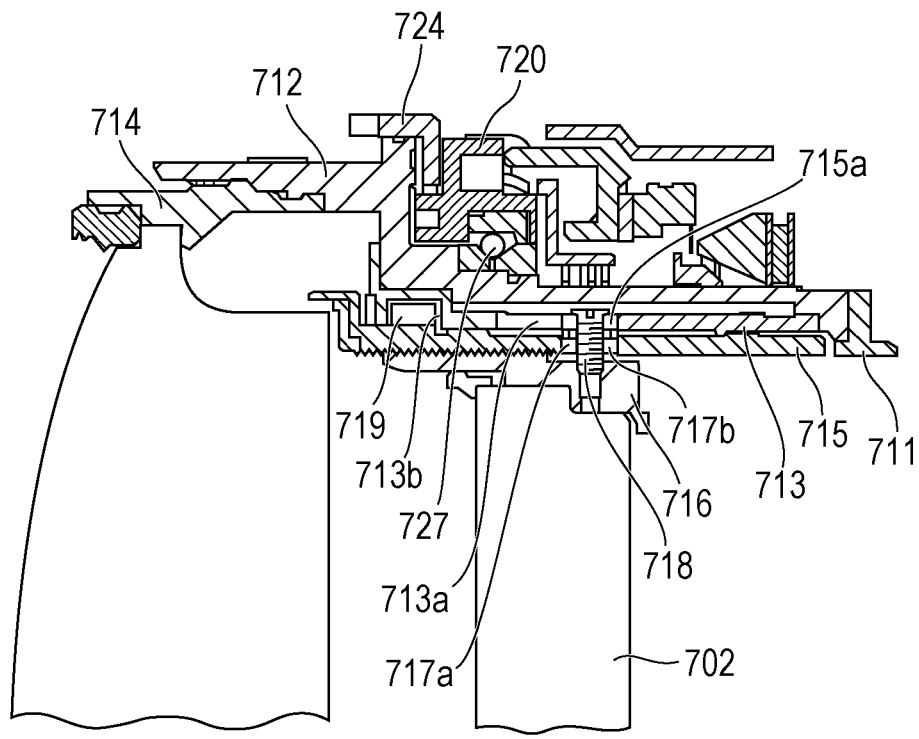
FIGS. 9A and 9B are schematic views of an optical device according to an embodiment the present invention.
Figure 9B:
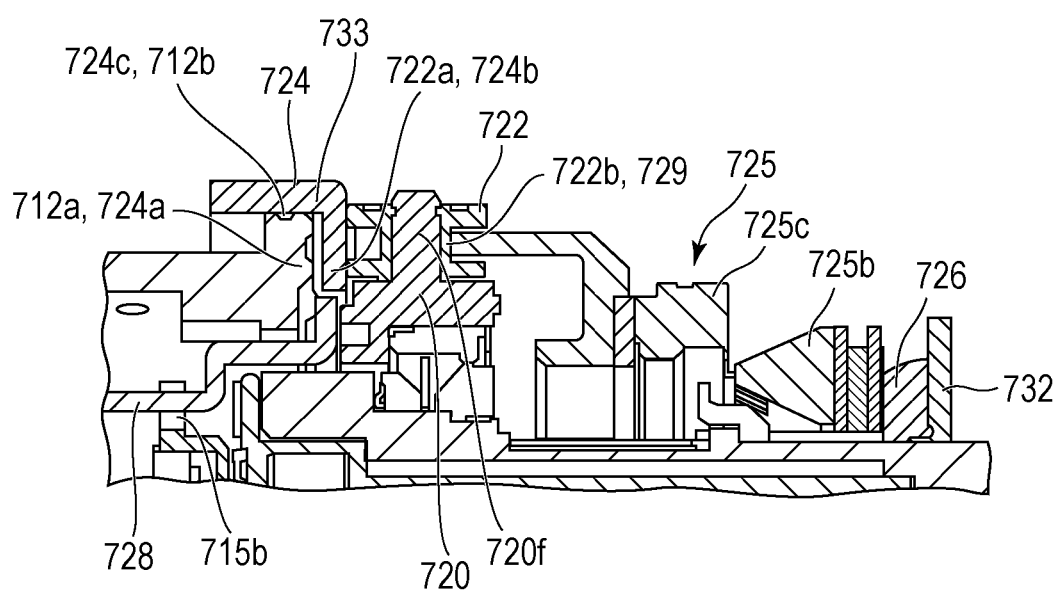
Figure 10:
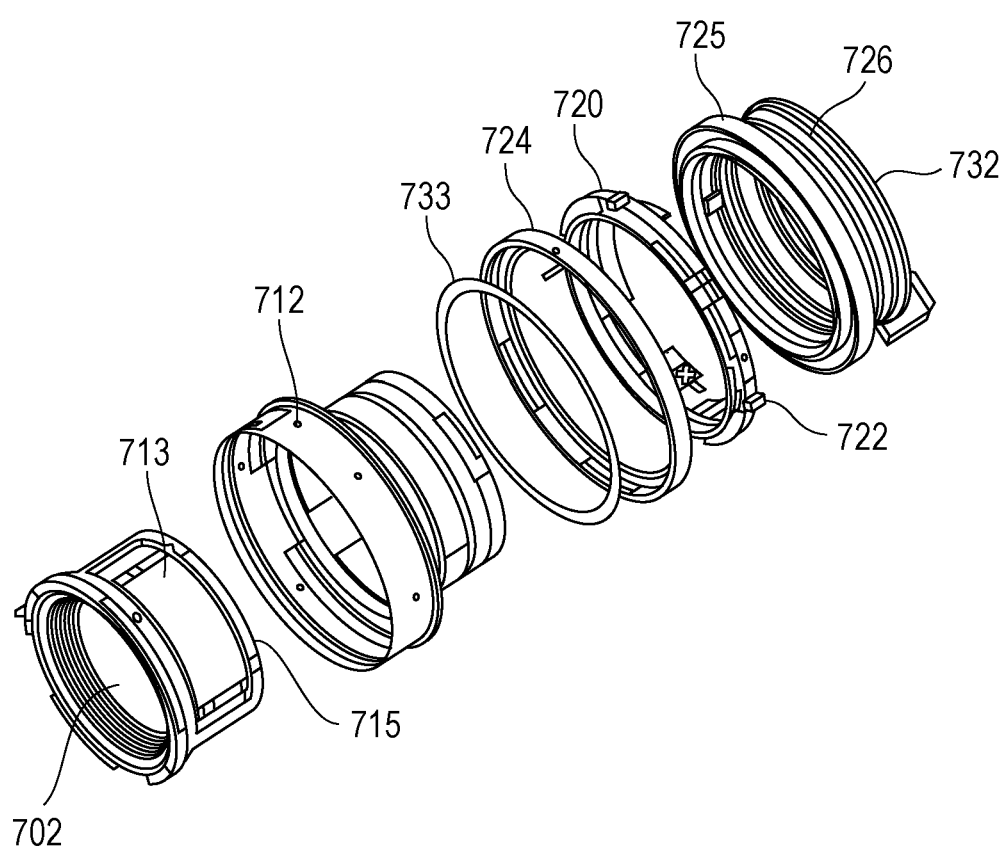
FIG. 10 is a schematic view of the optical device according to the embodiment the present invention.

FIGS. 9A and 9B are partial sectional views of an interchangeable lens for a single-lens reflex camera, which is an example of the optical device according to the embodiment the present invention. FIG. 10 is an exploded perspective view of the interchangeable lens for a single-lens reflex camera, which is an example of the optical device according to the embodiment the present invention. A fixed barrel 712, a linear guide barrel 713, and a front-group lens barrel 714 are fixed to an attachable/detachable mount 711, which can be attached to a camera. There are fixed members of the interchangeable lens.

The linear guide barrel 713 has a linear guide groove 713a for a focusing lens 702, extending in the optical axis direction. The focusing lens 702 is held by a rear-group lens barrel 716. Cam rollers 717a and 717b, protruding outward in the radial direction, are fixed to the rear-group lens barrel 716 with a screw 718. The cam roller 717a is fitted to the linear guide groove 713a.

A cam ring 715 is rotatably fitted to an inner periphery of the linear guide barrel 713. A roller 719, which is fixed to the cam ring 715, is fitted to a peripheral groove 713b of the linear guide barrel 713. Therefore, relative movement of the linear guide barrel 713 and the cam ring 715 is restricted in the optical axis direction. The cam ring 715 has a cam groove 715a for the focusing lens 702, and the cam roller 717b is fitted to the cam groove 715a.

A rotation transmitting ring 720 is disposed on the outer periphery of the fixed barrel 712. The rotation transmitting ring 720 is ratably supported by a ball race 727 so as to be rotatable relative to the fixed barrel 712. The rotation transmitting ring 720 rotatably holds rollers 722 on shafts 720f, which extend radially from the rotation transmitting ring 720. Large-diameter portions 722a of the rollers 722 are in contact with a mount-side end face 724b of a manual focusing ring 724. Small-diameter portions 722b of the rollers 722 are in contact with a joint member 729. The number of the rollers 722 is six, and the six rollers 722 are arranged at a regular pitch on the outer periphery of the rotation transmitting ring 720. The relationship between each of the rollers 722 and other components is the same as described above.

A low-friction sheet 733 (washer member) is disposed on an inner periphery of the manual focusing ring 724. The low-friction sheet 733 is sandwiched between a mount-side end face 712a of the fixed barrel 712 and a front end surface 724a of the manual focusing ring 724. The low-friction sheet 733 has an annular outer peripheral surface that is fitted to an inner periphery 724c of the manual focusing ring 724. Moreover, the inner periphery 724c of the manual focusing ring 724 is fitted to an outer periphery 712b of the fixed barrel 712. The low-friction sheet 733 functions to reduce friction of a rotary ring mechanism for rotating the manual focusing ring 724 around the optical axis relative to the fixed barrel 712.

The large-diameter portions 722a of the rollers 722 and the mount-side end face 724b of the manual focusing ring 724 are in pressed contact with each other due to a force with which a curved disc spring washer 726 presses an ultrasonic motor 725 forward. Likewise, due to the force with which the curved disc spring washer 726 presses the ultrasonic motor 725 forward, the small-diameter portions 722*b* of the rollers 722 and the joint member 729 are in pressed contact with each other with an appropriate pressure. Movement of the curved disc spring washer 726 in a mounting direction is restricted by a washer 732 that is in bayonet connection with the fixed barrel 712. A spring force (urging force) generated by the curved disc spring washer 726 is transmitted to the ultrasonic motor 725 and to the rollers 722, and the spring force also causes the manual focusing ring 724 to press the mount-side end face 712*a* of the fixed barrel 712. Thus, the manual focusing ring 724 is mounted in a state in which it is pressed against the mount-side end face 712*a* of the fixed barrel 712 via the low-friction sheet 733.

Accordingly, when a controller (not shown) causes the ultrasonic motor 725 to rotate relative to the fixed barrel 712, the rollers 722 rotate around the shafts 720*f* because the joint member 729 is in frictional contact with the small-diameter portions 722*b* of the rollers 722. As a result of the rollers 722 rotating around the shafts 720*f*, the rotation transmitting ring 720 rotates around the optical axis (auto-focusing operation).

When a rotational force around the optical axis is applied to the manual focusing ring 724 from a manual operation input unit (not shown), the optical device functions as follows. Because the mount-side end face 724*b* of the manual focusing ring 724 is in pressed contact with the large-diameter portions 722*a* of the rollers 722, the rollers 722 rotate around the shafts 720*f* due to a friction force. When the large-diameter portions 722*a* of the rollers 722 rotate around the shafts 720*f*, the rotation transmitting ring 720 rotates around the optical axis. At this time, the ultrasonic motor 725 does not rotate due to a frictional retention force of a rotor 725*c* and a stator 725*b* (manual focusing operation).

Two focusing keys 728 are attached to the rotation transmitting ring 720 so as to face each other. The focusing keys 728 are fitted to cutout portions 715*b* formed at an end of the cam ring 715. Accordingly, when an auto-focusing operation or a manual focusing operation is performed and the rotation transmitting ring 720 is rotated around the optical axis, the rotational force is transmitted through the focusing keys 728 to the cam ring 715. When the cam ring 715 is rotated around the optical axis, the rear-group lens barrel 716, whose rotation is restricted by the cam roller 717*a* and the linear guide groove 713*a*, is moved by the cam roller 717*b* along the cam groove 715*a* of the cam ring 715. Thus, the focusing lens 702 is driven and a focusing operation is performed.

In the above description, the interchangeable lens for a single-lens reflex camera is used as an example of the optical device according to the present invention. Alternatively, the optical device according to the present invention may be any optical device including a driving unit having an ultrasonic motor, such as a compact camera, an electric still camera, or the like.

Vibration Device and Dust Removing Device

Vibration devices for transporting or removing particles, powder, liquid, or the like are widely used in electronic apparatuses and the like. Hereinafter, as an example of a vibration device according to the present invention, a dust removing device including the piezoelectric element according to the present invention will be described.

The vibration device according to the present invention includes a vibration body including a diaphragm and the piezoelectric element on the diaphragm. The vibration device has a function of removing dust from a surface of the diaphragm. The dust removing device according to the present invention includes a vibration unit including the vibration device.

Figure 11A:
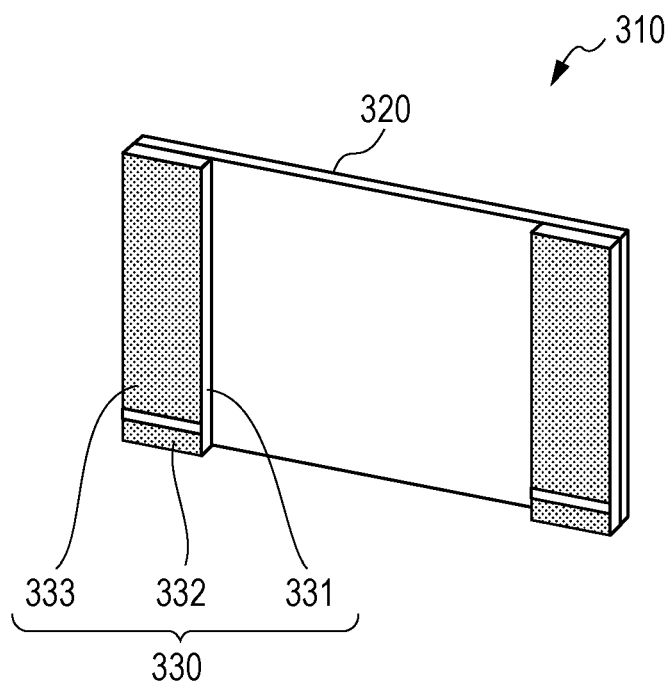
FIGS. 11A and 11B are schematic views of a vibration device according to an embodiment the present invention, which is used as a dust removing device.
Figure 11B:
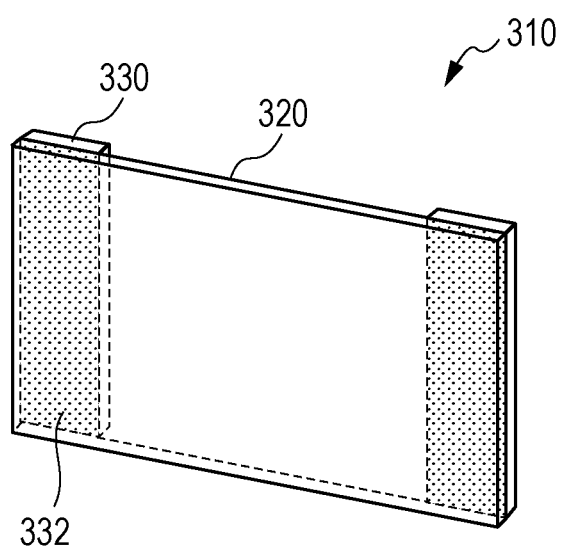

FIGS. 11A and 11B are schematic views of the dust removing device according to an embodiment the present invention. A dust removing device 310 includes piezoelectric elements 330, each having a plate-like shape, and a diaphragm 320. The material of the diaphragm 320 is not particularly limited. In order to use the dust removing device 310 for an optical device, a transparent material or a reflective material can be used as the diaphragm 320, and the dust removing device 310 removes dust from a transparent portion or a reflector portion of the diaphragm 320.

Figure 12A:
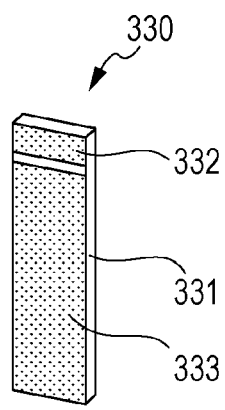
FIGS. 12A to 12C are schematic views illustrating the structure of a piezoelectric element of the dust removing device according to the present invention.
Figure 12B:
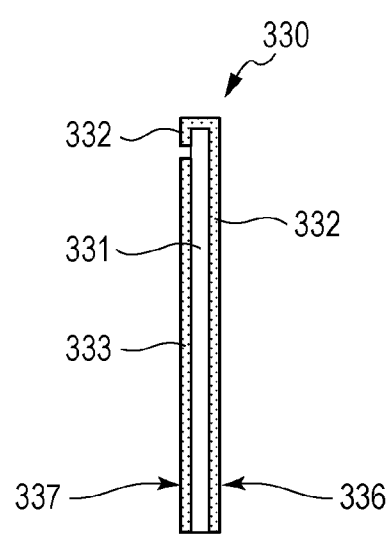
Figure 12C:
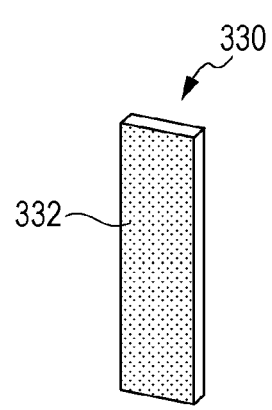

FIGS. 12A to 12C are schematic views illustrating the structure of one of the piezoelectric elements 330 shown in FIGS. 11A and 11B. FIGS. 12A and 12C respectively illustrate the front and back surfaces of the piezoelectric element 330, and FIG. 12B illustrates a side surface of the piezoelectric element 330. As illustrated in FIG. 11A, the piezoelectric element 330 includes a piezoelectric ceramic 331, a first electrode 332, and a second electrode 333. The first electrode 332 and the second electrode 333 are disposed so as to face plate surfaces of the piezoelectric ceramic 331. A first electrode surface 336 is one of the plate surfaces of the piezoelectric element 330, on which the first electrode 332 is disposed and which is shown in FIG. 12C. A second electrode surface 337 is the other plate surface of the piezoelectric element 330, on which the second electrode 333 is disposed and which is shown in FIG. 12A.

The term "electrode surface" refers to a surface of a piezoelectric element on which an electrode is disposed. As illustrated in FIG. 12B, for example, the first electrode 332 may extend to the second electrode surface 337.

As illustrated in FIGS. 11A and 11B, the piezoelectric element 330 and the diaphragm 320 are fixed to each other by affixing the first electrode surface 336 of the piezoelectric element 330 to a plate surface of the diaphragm 320. When the piezoelectric element 330 is driven, a stress is generated between the piezoelectric element 330 and the diaphragm 320, and thereby out-of-plane vibration occurs in a diaphragm. By using the out-of-plane vibration of the diaphragm 320, the dust removing device 310 according to the present invention removes foreign substances, such as dust, from a surface of the diaphragm 320. The term "out-of-plane vibration" refers to elastic vibration that causes a diaphragm to be displaced in the optical axis direction, that is, in the thickness direction of the diaphragm.

Figures 13A, 13B:
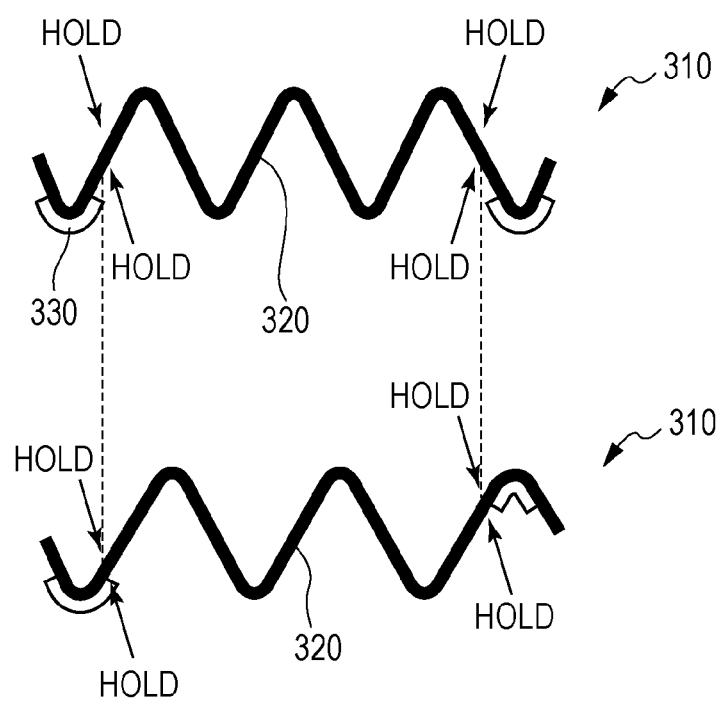
FIGS. 13A and 13B are schematic views illustrating the vibration principle of the dust removing device according to the present invention.

FIGS. 13A and 13B are schematic views illustrating the vibration principle of the dust removing device 310 according to the present invention. FIG. 13A illustrates a state in which alternating voltages having the same phase are applied to the pair of left and right piezoelectric elements 330 and the diaphragm 320 is performing out-of-plane vibration. The polarization direction of a piezoelectric ceramic included in the pair of left and right piezoelectric elements 330 is the same as the thickness direction of the piezoelectric elements 330. The dust removing device 310 is driven in a seventh-order vibration mode. FIG. 13B illustrates a state in which alternating voltages having opposite phases are applied to the pair of left and right piezoelectric elements 330 and the diaphragm 320 is performing out-of-plane vibration. The dust removing device 310 is driven in a sixth-order vibration mode. The dust removing device 310 according to the present invention can efficiently remove dust from a surface of the diaphragm by selectively using at least two vibration modes.

Imaging Apparatus

Figure 14:
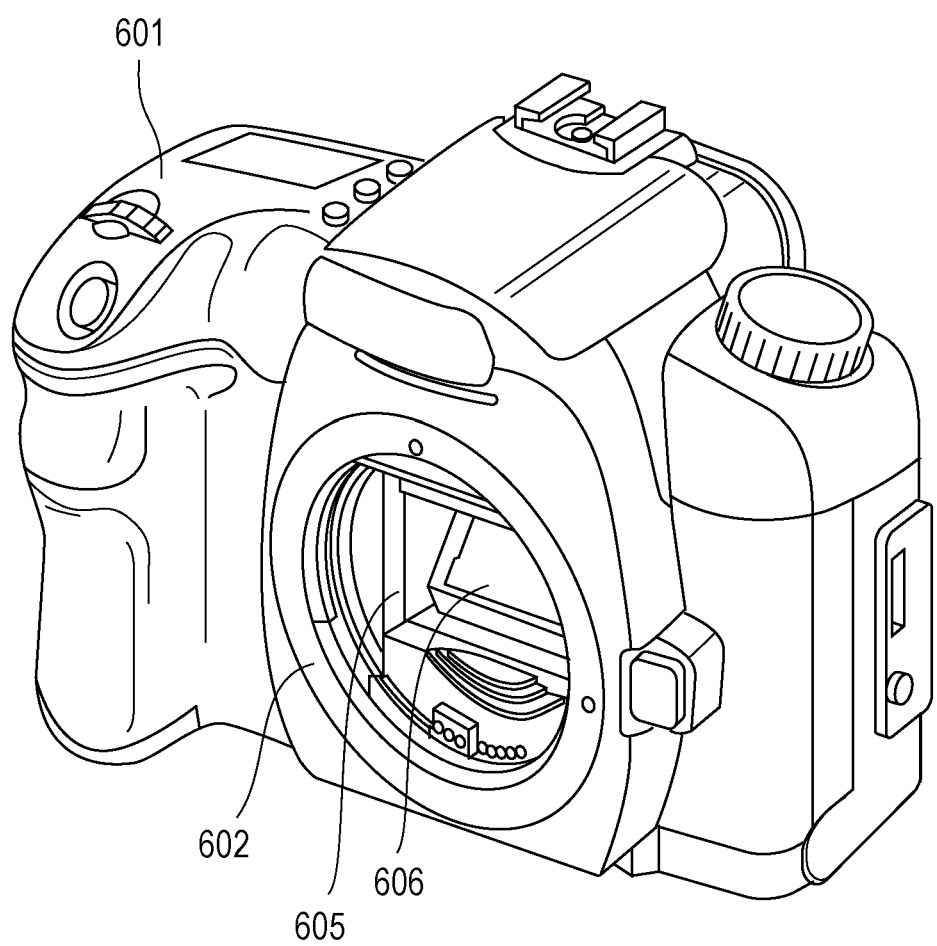
FIG. 14 is a schematic view of an imaging apparatus according to an embodiment the present invention.
Figure 15:
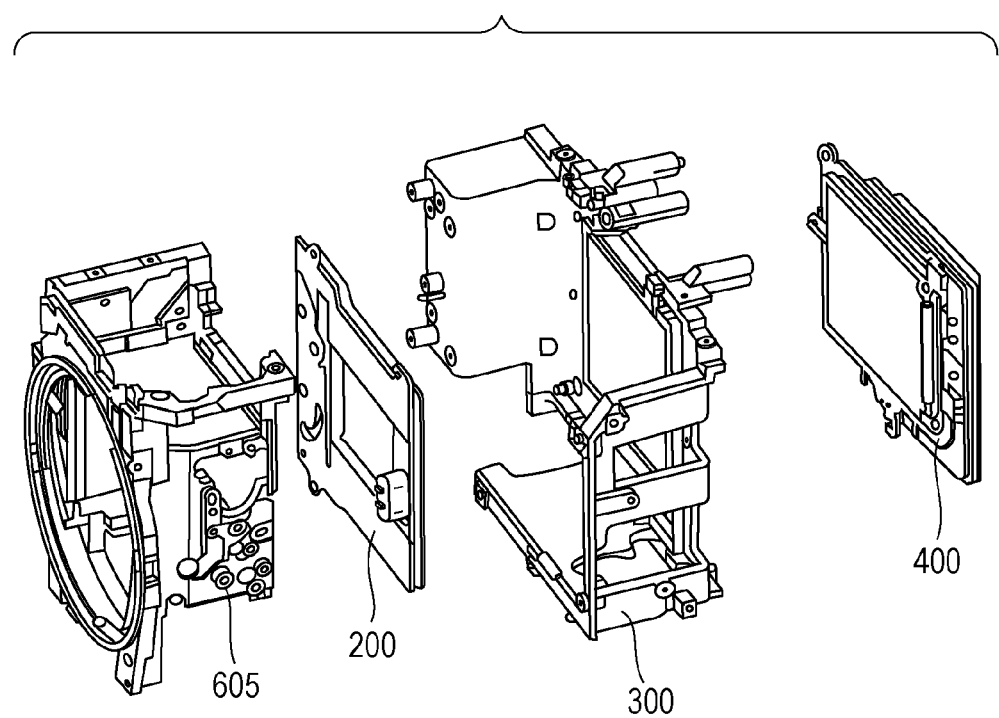
FIG. 15 is a schematic view of the imaging apparatus according to the embodiment the present invention.

Next, an imaging apparatus according to the present invention will be described. The imaging apparatus according to the present invention includes the dust removing device and an imaging element unit, and a diaphragm of the dust removing device is disposed on the light-receiving side of the imaging element unit. FIGS. 14 and 15 illustrate a digital single-lens reflex camera, which is an example of an imaging device according to an embodiment of the present invention.

FIG. 14 is a front perspective view of a camera body 601 seen from the object side, illustrating a state in which an imaging lens unit is removed. FIG. 15 is an schematic exploded perspective view illustrating an inner part of the camera including the dust removing device and an imaging unit 400.

In the camera body 601 illustrated in FIG. 14, a mirror box 605, to which an imaging light beam that has passed through an imaging lens is guided, is disposed. A main mirror 606 (instant return mirror) is disposed on the mirror box 605. The position of the main mirror 606 can be changed between a position in which the main mirror 606 has an angle of 45° with respect to the imaging optical axis so that an imaging light beam is guided toward a roof mirror (not shown) and a position in which the main mirror 606 is retracted from the imaging light beam so that an imaging light beam is guided toward an imaging element (not shown).

In FIG. 15, on the object side of a body chassis 300, which serves as a frame of the camera body, the mirror box 605 and a shutter unit 200 are arranged from the object side. The imaging unit 400 is disposed on the photographer side of the body chassis 300. The imaging unit 400 includes a diaphragm of the dust removing device and an imaging element unit. The diaphragm of the dust removing device and the light-receiving surface of the imaging element unit are arranged in this order along the same axis. The imaging unit 400 is disposed on an attachment surface of a mounting portion 602 (see FIG. 14), which serves as a reference surface for attaching the imaging lens unit. The imaging unit 400 is adjusted so that the image plane of the imaging element is separated from the imaging lens unit by a predetermined distance and is parallel to the imaging lens unit.

In the above description, the digital single-lens reflex camera is used as an example of the imaging apparatus according to the present invention. Alternatively, the imaging apparatus according to the present invention may be, for example, an interchangeable lens camera that does not include the mirror box 605, such as a mirrorless digital single-lens reflex camera. Further alternatively, the imaging apparatus according to the present invention may be an electronic/electric apparatus, such as an interchangeable lens video camera, a copier, a facsimile, a scanner, or an electric equipment including the imaging apparatus, for which it is necessary to remove dust from a surface of an optical component.

Electronic Apparatus

Next, an electronic apparatus according to the present invention will be described. The electronic apparatus according to the present invention includes a piezoelectric acoustic component including the piezoelectric element. Examples of the piezoelectric acoustic component include a speaker, a buzzer, a microphone, and a surface acoustic wave (SAW) element.

Figure 16:
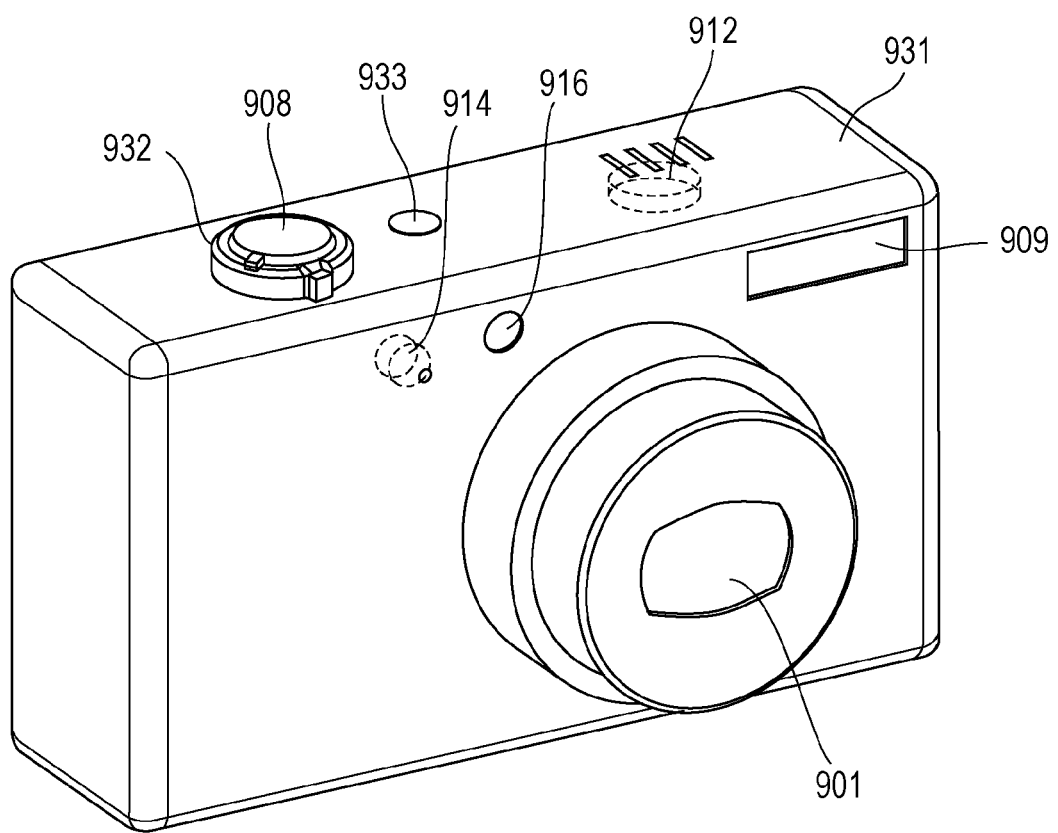
FIG. 16 is a schematic view of an electronic apparatus according to an embodiment the present invention.

FIG. 16 is a front perspective view of a body 931 of a digital camera, which is an example of an electric apparatus according to an embodiment of the present invention. An optical device 901, a microphone 914, a flash 909, and an auxiliary light unit 916 are disposed on the front side of the body 931. The microphone 914, which is disposed inside the body, is shown by a broken line. A microphone hole is disposed in front of the microphone 914.

A power button 933, a speaker 912, a zoom lever 932, and a release button 908 for performing a focusing operation are disposed on the upper side of the body 931. The speaker 912, which is disposed inside the body 931, is shown by a broken line. Speaker holes are disposed in front of the speaker 912.

A piezoelectric acoustic component according to the present invention is used in least one of the microphone 914, the speaker 912, and a surface acoustic wave element.

In the above description, the digital camera is used as an example of an electronic apparatus according to the present invention. Alternatively, an electric apparatus according to the present invention may be any electric apparatus including a piezoelectric acoustic component, such as an audio player, an audio recorder, a cellular phone, or an information terminal.

As described above, the piezoelectric element according to the present invention can be used, for example, as a liquid ejection head, a liquid ejection apparatus, an ultrasonic motor, an optical device, a vibration device, a dust removing device, an imaging apparatus, or an electronic apparatus.

By using the piezoelectric element according to the present invention, it is possible to provide a liquid ejection head that has power consumption, nozzle density, and ejection speed that are equivalent to or better than those of a liquid ejection head including a piezoelectric element including lead.

By using the liquid ejection head according to the present invention, it is possible to provide a liquid ejection apparatus that has power consumption, ejection speed, ejection precision that are equivalent to or better than those of a liquid ejection apparatus including a piezoelectric element including lead.

By using the piezoelectric element according to the present invention, it is possible to provide an ultrasonic motor that has power consumption, driving power, and durability that are equivalent to or better than those of an ultrasonic motor including a piezoelectric element including lead.

By using the ultrasonic motor according to the present invention, it is possible to provide an optical device that has power consumption, durability, and operation precision that are equivalent to or better than those of an optical device including an ultrasonic motor including a piezoelectric element including lead.

By using the piezoelectric element according to the present invention, it is possible to provide a vibration device that has power consumption, driving ability, and durability that are equivalent to or better than those of a vibration device including a piezoelectric element including lead.

By using the vibration device according to the present invention, it is possible to provide a dust removing device that has power consumption, dust removing efficiency, and durability that are equivalent to or better than those of a dust removing device including a vibration device including a piezoelectric element including lead.

By using the dust removing device according to the present invention, it is possible to provide an imaging apparatus that has power consumption and dust removing function that are equivalent to or better than those of an imaging apparatus including a piezoelectric element including lead.

By using the piezoelectric acoustic component according to the present invention, it is possible to provide an electronic apparatus that has power consumption and acoustic performance that are equivalent to or better than those of an electronic apparatus including a piezoelectric acoustic component including a piezoelectric element including lead.

The piezoelectric element according to the present invention can be used not only for a liquid ejection head and a motor but also for devices such as an ultrasonic vibrator, a piezoelectric actuator, a piezoelectric sensor, and a ferroelectric memory.

EXAMPLES

Hereinafter, examples of the piezoelectric element according to the present invention will be more specifically described. Note that the present invention is not limited to these examples.

Fabrication and Evaluation of Piezoelectric Element

Example 1

Fabrication and Evaluation of Piezoelectric Ceramic

In the following formula, $0.125 \leq x \leq 0.300$, $0.041 \leq y \leq 0.080$, and $0.986 \leq \alpha \leq 1.020$:

$$(Ba_{1-x}Ca_x)_\alpha(Ti_{1-y}Zr_y)O_3 \quad (1).$$

Powder of a material $(Ba_{0.84}Ca_{0.16})_{1.006}(Ti_{0.94}Zr_{0.06})O_3$, which is a substance represented by the general formula (1) $((Ba_{1-x}Ca_x)_\alpha(Ti_{1-y}Zr_y)O_3)$ where $x=0.16$, $y=0.06$, and $\alpha=1.006$, was measured as described below.

Barium titanate powder, calcium titanate powder, calcium zirconate powder, and barium carbonate powder, each having a perovskite structure, made by using a solid phase method, and having a particle diameter of 300 nm, were weighed so as to have the ratio of the above chemical formula.

Trimanganese tetraoxide was measured so that Mn becomes 0.24 parts by weight with respect to 100 parts by weight of a metal oxide represented by the chemical formula $(Ba_{0.84}Ca_{0.16})_{1.006}(Ti_{0.94}Zr_{0.06})O_3$. The measured powder of these materials was mixed by performing dry blending for 24 hours using a ball mill. By using a spray dryer, 3 parts by weight of a PVA binder, with respect to the mixed powder, was made to adhere to the surfaces of particles of the mixed powder, thereby performing granulation.

Next, a die was filled with the granulated powder, a pressure of 200 MPa was applied by using a press-forming machine, thereby making a disk-shaped compact.

The compact was placed in an electric furnace, held at a condition of a highest temperature of 1340° C. for 5 hours, sintered for 24 hours in the atmosphere, thereby obtaining a piezoelectric ceramic.

The average equivalent circle diameter and the relative density of crystal grains of the piezoelectric ceramic were evaluated. As a result, the average equivalent circle diameter was 6.8 μm, and the relative density was 94.3%. A polarizing microscope was used to observe the crystal grains. Image processing was performed on a photographic image obtained by using the polarizing microscope, and the average equivalent circle diameter was calculated. The relative density by was evaluated by using Archimedes' method.

Next, the composition of the piezoelectric ceramic was evaluated by performing X-ray fluorescence analysis and ICP emission spectroscopy. As a result, it was found that the Mn content was 0.24 parts by weight with respect to 100 parts by weight of a metal oxide represented by a chemical formula $(Ba_{0.84}Ca_{0.16})_{1.006}(Ti_{0.94}Zr_{0.06})O_3$. This means that the composition after sintering coincided with the measured composition. Elements other than Ba, Ca, Ti, Zr, and Mn were included with an amount of detection limit or less, that is, less than 0.001 parts by weight.

Fabrication of Electrode

The obtained piezoelectric ceramic was polished so as to have a thickness of 0.5 mm, and electrodes each having a thickness of 3 μm were formed on both sides of the ceramic by applying and baking an Ag paste. The baking condition was as follows. First, the piezoelectric ceramic was heated to 800° C. at a rate of 5° C./min and held at 800° C. for 5 minutes. Subsequently, the piezoelectric ceramic was cooled at a rate of 350° C./h to 40° C., and the ceramic with electrodes was taken out of an electric furnace.

Polarizing

The ceramic with electrodes was placed on a hot plate that had been heated to 140° C., and an electric field of 0.6 kV/mm was applied to the electrodes on the front and back sides for 30 minutes. Subsequently, the hot plate was cooled at a rate of 200° C./h to 40° C., and application of voltage was stopped, thereby obtaining the piezoelectric element according to the present invention.

Evaluation of X-Ray Diffraction

The piezoelectric element was cut into square-shaped piezoelectric elements each having a size of 20 mm×20 mm×0.5 mm.

Before evaluating the crystal structure of a piezoelectric ceramic having residual polarization, the piezoelectric element was polished. First, in order to remove an Ag electrode, polishing was performed by using a polishing paper having a grit size of #2000. Subsequently, in order to remove a surface layer of the piezoelectric ceramic, buffing was performed by using colloidal silica. After having been buffed, the surface roughness Ra, evaluated by using a stylus profiler (DektakXT, made by Ulbac Inc.), was 188 nm.

Next, the crystal structure of the polished piezoelectric ceramic was evaluated. At this time, the room temperature was 25° C. Evaluation was performed by using an XRD (X'Pert MRD, made by PANalytical B.V.) with a 2θ-θ method. A Cu-Kα tube was used as an X-ray source, the tube voltage was 45 kV, and tube current was 40 mA. The 2θ measurement range was 20° to 50°, the scanning speed was 0.10 degrees/min, and the sampling interval was 0.01 degrees. The spot diameter of incident beam was 10 mm. As a result, the (002)/(200) diffraction intensity ratio of the measurement surface was 1.21, the ratio c/a was 1.007, and the half-width of the (002) diffraction peak of the measurement surface was 0.40°.

Evaluation of Electric Characteristics

The piezoelectric element was cut into strip-shaped piezoelectric elements each having a size of 10 mm×2.5 mm×0.5 mm.

The relative permittivity εr, the electromechanical coupling factor $k_{31}$, and the mechanical quality factor Qm of the strip-shaped piezoelectric element were evaluated by using an impedance analyzer. At this time, the room temperature was 25° C. The application voltage of the impedance analyzer was 0.05 $V_{pp}$. As a result, the relative permittivity εr=1740, the electromechanical coupling factor $k_{31}$=0.221, and Qm=1650. The electromechanical coupling factor $k_{31}$ and the mechanical quality factor Qm were evaluated by using a resonance-antiresonance method.

Next, the power consumption of the strip-shaped piezoelectric element was evaluated. An alternating voltage of 10 $V_{pp}$ was applied, and the value of power consumption when the frequency was changed so that the displacement became 1.0 μm was measured by using a powermeter. The displacement was measured by using a laser Doppler vibrometer. At this time, the power consumption was 16 mW.

Examples 2 to 9

Piezoelectric ceramics according to Examples 2 to 9 were made through a process the same as that of Example 1, except that bismuth oxide powder was used as the powder material. Table 1 shows the weight ratios of the components. In Table 1, A/B is the ratio of the sum A of the numbers of moles of Ba and Ca to the sum B of the numbers of moles of Ti, Zr, and Mn. Next, in the same way as in Example 1, the average equivalent circle diameter and the relative density were evaluated. Table 2 shows the results of the evaluation. As a result of performing composition analysis in the same way as in Example 1, it was found that, for each of the samples, the composition after sintering coincided with the composition shown in Table 1 to a precision of the significant digits shown in Table 1.

Next, piezoelectric elements according to Examples 2 to 9 were made through a process the same as that of Example 1; and the crystal structure of the piezoelectric ceramic, the relative permittivity ∈r, the electromechanical coupling factor $k_{31}$, the mechanical quality factor Qm, and the power consumption of each of the piezoelectric elements were evaluated. At this time, the room temperature was 25° C. Tables 3 and 4 show the results of the evaluation. The piezoelectric elements according to Examples 2 to 9 were polished through a process the same as that of Example 1. The surface roughness Ra, which was evaluated by using a stylus profiler, was in the range of 160 nm to 192 nm.

Comparative Example 1

Fabrication and Evaluation of Piezoelectric Ceramic

Barium titanate powder having a perovskite structure, which was obtained by using a hydrothermal synthesis method and which had a particle diameter of 100 nm, was prepared, and 3 parts by weight of a PVA binder was made to adhere to the surface of the barium titanate powder, thereby performing granulation.

Next, a die was filled with the granulated powder, a pressure of 200 MPa was applied by using a press-forming machine, thereby making a disk-shaped compact.

The compact was placed in an electric furnace, and sintering was performed according to the following sintering profile, thereby obtaining a piezoelectric ceramic: the compact was heated to 1390° C. at a rate of 15° C./min, held at 1390° C. for 1 minute, cooled to 1190° C. at a rate of 30° C./min, held at 1190° C. for 4 hours, and subsequently cooled to room temperature at a rate of 5° C./min.

The average equivalent circle diameter and the relative density of crystal grains of the piezoelectric ceramic were evaluated. As a result, the average equivalent circle diameter was 8.1 μm, and the relative density was 94.9%. A polarizing microscope was used to observe the crystal grains. Image processing was performed on a photographic image obtained by using the polarizing microscope, and the average equivalent circle diameter was calculated. The relative density by was evaluated by using Archimedes' method.

Next, the composition of the piezoelectric ceramic was evaluated by performing X-ray fluorescence analysis and ICP emission spectroscopy. As a result, it was found that the composition could be represented by a chemical formula $Ba_{1.000}TiO_3$. This means that the composition after sintering coincided with the measured composition. Elements other than Ba and Ti were included with an amount of detection limit or less, that is, less than 0.001 parts by weight.

Fabrication of Electrode

The obtained piezoelectric ceramic was polished so as to have a thickness of 0.5 mm, and electrodes each having a thickness of 3 μm were formed on both sides of the ceramic by applying and baking an Ag paste. The baking condition was as follows. First, the piezoelectric ceramic was heated to 600° C. at a rate of 5° C./min and maintained at 600° C. for 2 hours. Subsequently, the piezoelectric ceramic was cooled at a rate of 50° C./h to 40° C., and the ceramic was taken out of an electric furnace.

Polarizing

The ceramic with electrodes was placed in a silicone oil that has been heated to 80° C., and an electric field of 1.0 kV/mm was applied to the electrodes on the front and back sides for 30 minutes. Subsequently, the silicone oil was cooled at a rate of 50° C./h, and application of electric field was stopped, thereby obtaining a piezoelectric element according to a comparative example 1.

Evaluation of X-Ray Diffraction

The piezoelectric element was cut into square-shaped piezoelectric elements each having a size of 20 mm×20 mm×0.5 mm.

Next, before evaluating the crystal structure of a piezoelectric ceramic, the piezoelectric element was polished. First, in order to remove Ag electrodes, polishing was performed by using a polishing paper having a grit size of #2000. Subsequently, in order to remove a surface layer of the piezoelectric ceramic, buffing was performed by using colloidal silica. After buffing, the surface roughness Ra, evaluated by using a stylus profiler, was 164 nm.

Next, the crystal structure of the polished piezoelectric ceramic was evaluated. At this time, the room temperature was 25° C. Evaluation was performed by using an XRD with a 2θ–θ method. A Cu-Kα tube was used as an X-ray source, the tube voltage was 45 kV, and tube current was 40 mA. The 2θ measurement range was 20° to 50°, the scanning speed was 0.10 degrees/min, and the sampling interval was 0.01 degrees. The spot diameter of incident beam was 10 mm. As a result, the (002)/(200) diffraction intensity ratio of the measurement surface was 0.97, the ratio c/a was 1.009, and the half-width of the (002) diffraction peak of the measurement surface was 0.13°.

Evaluation of Electric Characteristics

The piezoelectric element was cut into strip-shaped piezoelectric elements each having a size of 10 mm×2.5 mm×0.5 mm.

The relative permittivity ∈r, the electromechanical coupling factor $k_{31}$, and the mechanical quality factor Qm of the strip-shaped piezoelectric element were evaluated by using an impedance analyzer. At this time, the room temperature was 25° C. The application voltage of the impedance analyzer was 0.05 $V_{pp}$. As a result, the relative permittivity ∈r=3650, the electromechanical coupling factor $k_{31}$=0.188, and Qm=280. The electromechanical coupling factor $k_{31}$ and the mechanical quality factor Qm were evaluated by using a resonance-antiresonance method.

Next, the power consumption of the strip-shaped piezoelectric element was evaluated. An alternating voltage of 10 $V_{pp}$ was applied, and the value of power consumption when the frequency was changed so that the displacement became 1.0 μm was measured by using a powermeter. The displacement was measured by using a laser Doppler vibrometer. At this time, the power consumption was 72 mW.

Comparative Example 2

Fabrication and Evaluation of Piezoelectric Ceramic

In order to make a piezoelectric ceramic according to comparative example 2, a compact was made through a process the same as that of Examples 2 to 9. Table 1 shows the weight ratios of the components.

The compact was placed in an electric furnace, held at a condition of a highest temperature of 1340° C. for 5 hours, sintered for 24 hours in the atmosphere, thereby obtaining a piezoelectric ceramic.

The average equivalent circle diameter and the relative density of crystal grains of the piezoelectric ceramic of comparative example 2 were evaluated through a process the same as that of comparative example 1. Table 2 illustrates the results of the evaluation. The surface roughness Ra, evaluated by using a stylus profiler, was 170 nm.

Next, the composition of the piezoelectric ceramic was evaluated by performing X-ray fluorescence analysis and ICP emission spectroscopy. As a result, it was found that the Mn content was 0.24 parts by weight with respect to 100 parts by weight of a metal oxide represented by a chemical formula $(Ba_{0.84}Ca_{0.16})_{1.007}(Ti_{0.94}Zr_{0.06})O_3$. This means that the composition after sintering coincided with the measured composition. Elements other than Ba, Ca, Ti, Zr, and Mn were included with an amount of detection limit or less, that is, less than 0.001 parts by weight.

Fabrication of Electrode

The obtained piezoelectric ceramic was polished so as to have a thickness of 0.5 mm, and gold electrodes each having a thickness of 400 nm were formed on both sides of the ceramic by DC sputtering. A contact layer, having a thickness of 30 nm and made of titanium, was deposited between each of the electrodes and the ceramic. The deposition was performed without applying heat. Heat treatment was not performed after the gold electrodes had been formed.

Polarizing

The ceramic with electrodes was placed on a hot plate that had been heated to 100° C., and an electric field of 1.0 kV/mm was applied to the electrodes on the front and back sides for 30 minutes. Subsequently, cooling was performed at a rate of 50° C./h, and application of electric field was stopped, thereby obtaining a piezoelectric element according to comparative example 2.

Evaluation of X-Ray Diffraction

Next, the piezoelectric element according to comparative example 2 was polished through a process the same as that of comparative example 1. The surface roughness Ra, which was evaluated by using a stylus profiler, was 194 nm.

Next, the crystal structure of the piezoelectric ceramic according to comparative example 2 was evaluated through a process the same as that of comparative example 1. At this time, the room temperature was 25° C. As a result, the (002)/(200) diffraction intensity ratio of the measurement surface was 0.91, the ratio c/a was 1.006, and the half-width of the (002) diffraction peak of the measurement surface was 0.38°.

Evaluation of Electric Characteristics

Next, through a process the same as that of comparative example 1, the relative permittivity ∈r, the electromechanical coupling factor $k_{31}$, the mechanical quality factor Qm, and the power consumption were evaluated. At this time, the room temperature was 25° C. As a result, the relative permittivity ∈r=1760, the electromechanical coupling factor $k_{31}$=0.191, Qm=1600, and the power consumption was 29 mW.

Comparative Example 3

In order to make a piezoelectric ceramic according to comparative example 3, a compact was made through a process the same as that of comparative example 2. Table 1 shows the weight ratios of the components.

The compact was placed in an electric furnace, held at a condition of a highest temperature of 1440° C. for 5 hours, sintered for 24 hours in the atmosphere, thereby obtaining a piezoelectric ceramic.

The average equivalent circle diameter and the relative density of the piezoelectric ceramic of comparative example 3 were evaluated through a process the same as that of comparative example 2. Table 2 illustrates the results of the evaluation. The surface roughness Ra, evaluated by using a stylus profiler, was 179 nm.

Next, the composition of the piezoelectric ceramic was evaluated by performing X-ray fluorescence analysis and ICP emission spectroscopy. As a result, it was found that the Mn content was 0.24 parts by weight with respect to 100 parts by weight of a metal oxide represented by a chemical formula $(Ba_{0.84}Ca_{0.16})_{1.016}(Ti_{0.90}Zr_{0.10})O_3$. This means that the composition after sintering coincided with the measured composition. Elements other than Ba, Ca, Ti, Zr, and Mn were included with an amount of detection limit or less, that is, less than 0.001 parts by weight.

Fabrication of Electrode

The obtained piezoelectric ceramic was polished so as to have a thickness of 0.5 mm, and gold electrodes each having a thickness of 400 nm were formed on both sides of the ceramic by DC sputtering. A contact layer, having a thickness of 30 nm and made of titanium, was deposited between each of the electrodes and the ceramic. The deposition was performed without applying heat. Heat treatment was not performed after the gold electrodes had been formed.

Polarizing

The ceramic with electrodes was placed on a hot plate that had been heated to 100° C., and an electric field of 1.0 kV/mm was applied to the electrodes on the front and back sides for 30 minutes. Subsequently, cooling was performed at a rate of 50° C./h, and application of electric field was stopped, thereby obtaining a piezoelectric element according to comparative example 3.

Evaluation of X-Ray Diffraction

Next, the piezoelectric element according to comparative example 3 was polished through a process the same as that of comparative example 2. The surface roughness Ra, which was evaluated by using a stylus profiler, was 153 nm.

Next, the crystal structure of the piezoelectric ceramic according to comparative example 3 was evaluated through a process the same as that of comparative example 2. At this time, the room temperature was 25° C. As a result, the (002)/(200) diffraction intensity ratio of the measurement surface was 1.09, the ratio c/a was 1.001, and the half-width of the (002) diffraction peak of the measurement surface was 0.50°.

Evaluation of Electric Characteristics

Next, through a process the same as that of comparative example 2, the relative permittivity ∈r, the electromechanical coupling factor $k_{31}$, the mechanical quality factor Qm, and the power consumption were evaluated. At this time, the room temperature was 25° C.

As a result, the relative permittivity ∈r=2520, the electromechanical coupling factor $k_{31}$=0.188, Qm=1900, and the power consumption was 31 mW.

TABLE 1

|  | x | y | α | Mn (parts by weight) | Bi (parts by weight) | A/B |
|---|---|---|---|---|---|---|
| Example 1 | 0.160 | 0.060 | 1.006 | 0.24 | 0.00 | 0.997 |
| Example 2 | 0.140 | 0.080 | 1.002 | 0.16 | 0.03 | 0.996 |
| Example 3 | 0.125 | 0.060 | 1.001 | 0.04 | 0.28 | 0.999 |

TABLE 1-continued

|  | x | y | α | Mn (parts by weight) | Bi (parts by weight) | A/B |
|---|---|---|---|---|---|---|
| Example 4 | 0.140 | 0.074 | 1.012 | 0.36 | 0.44 | 0.997 |
| Example 5 | 0.300 | 0.045 | 1.002 | 0.12 | 0.00 | 0.998 |
| Example 6 | 0.180 | 0.041 | 1.004 | 0.14 | 0.60 | 0.998 |
| Example 7 | 0.160 | 0.060 | 1.016 | 0.50 | 0.15 | 0.996 |
| Example 8 | 0.160 | 0.060 | 1.003 | 0.12 | 0.80 | 0.998 |
| Example 9 | 0.000 | 0.000 | 1.003 | 0.10 | 0.00 | 0.999 |
| Comparative Example 1 | 0.000 | 0.000 | 1.000 | 0.00 | 0.00 | 1.000 |
| Comparative Example 2 | 0.160 | 0.060 | 1.007 | 0.24 | 0.00 | 0.997 |
| Comparative Example 3 | 0.160 | 0.100 | 1.016 | 0.40 | 0.00 | 1.000 |

TABLE 2

|  | Relative Density (%) | Average Grain Diameter (μm) |
|---|---|---|
| Example 1 | 94.3 | 6.8 |
| Example 2 | 98.1 | 7.6 |
| Example 3 | 95.2 | 2.5 |
| Example 4 | 96.9 | 4.1 |
| Example 5 | 94.3 | 5.2 |
| Example 6 | 93.1 | 8.9 |
| Example 7 | 97.8 | 3.4 |
| Example 8 | 96.2 | 4.3 |
| Example 9 | 97.5 | 8.7 |
| Comparative Example 1 | 94.9 | 8.1 |
| Comparative Example 2 | 91.7 | 5.1 |
| Comparative Example 3 | 92.1 | 7.3 |

TABLE 3

|  | (002)/(200) Diffraction Intensity Ratio | c/a | (002) half-width (°) | k31@ 25° C. | εr@ 25° C. | Qm@ 25° C. |
|---|---|---|---|---|---|---|
| Example 1 | 1.21 | 1.007 | 0.40 | 0.221 | 1740 | 1650 |
| Example 2 | 1.31 | 1.004 | 0.54 | 0.251 | 2050 | 1500 |
| Example 3 | 1.24 | 1.006 | 0.39 | 0.231 | 1820 | 450 |
| Example 4 | 1.26 | 1.005 | 0.34 | 0.248 | 2030 | 1800 |
| Example 5 | 1.16 | 1.008 | 0.38 | 0.216 | 1380 | 840 |
| Example 6 | 1.14 | 1.009 | 0.33 | 0.212 | 1460 | 880 |
| Example 7 | 1.03 | 1.007 | 0.31 | 0.210 | 1600 | 2150 |
| Example 8 | 1.25 | 1.007 | 0.30 | 0.246 | 1750 | 1300 |
| Example 9 | 1.08 | 1.010 | 0.33 | 0.202 | 2400 | 1600 |
| Comparative Example 1 | 0.97 | 1.009 | 0.13 | 0.188 | 3650 | 280 |
| Comparative Example 2 | 0.91 | 1.006 | 0.38 | 0.191 | 1760 | 1600 |
| Comparative Example 3 | 1.09 | 1.001 | 0.50 | 0.188 | 2520 | 1900 |

TABLE 4

|  | Power Consumption (mW) |
|---|---|
| Example 1 | 16 |
| Example 2 | 12 |
| Example 3 | 21 |
| Example 4 | 12 |
| Example 5 | 23 |
| Example 6 | 22 |
| Example 7 | 16 |
| Example 8 | 14 |
| Example 9 | 25 |
| Comparative Example 1 | 72 |
| Comparative Example 2 | 29 |
| Comparative Example 3 | 31 |

Tables 1 to 4 will be examined below. First, the values of electromechanical coupling factors $k_{31}$ of Examples 1 to 9 and comparative examples 1 to 3 are compared with each other. The values of electromechanical coupling factors $k_{31}$ of the Examples 1 to 9 were 0.202 or greater. Therefore, the values of power consumption were 25 mW or less, which were smaller than those of comparative examples 1 to 3. In particular, the values of power consumption of Examples 1, 2, 4, 7, and 8 were 20 mW or less. These piezoelectric elements each had a high electromechanical coupling factor $k_{31}$, a small relative permittivity εr of 2050 or less, and a high Qm of 1300 or more.

Comparative example 1 had an electromechanical coupling factor $k_{31}$ of less than 0.200, because the (002)/(200) diffraction intensity ratio was less than 1.0. Moreover, comparative example 1 had a high power consumption of 72 mW. Presumably, this occurred because the capacitance electric power increased due to high relative permittivity and the driving electric power increased due to small mechanical quality factor Qm.

Comparative example 2 also had an electromechanical coupling factor $k_{31}$ of less than 0.200, because (002)/(200) diffraction intensity ratio was less than 1.0. Moreover, comparative example 2 had a high power consumption of 29 mW, which was less than that of comparative example 1. Presumably, this occurred because the capacitance electric power was small due to a relative permittivity εr smaller than that of comparative 1 and the driving electric power was small due to large mechanical quality factor Qm.

Comparative example 3 had a ratio c/a less than 1.004. Moreover, comparative example 3 had a power consumption of 31 mW, which was less than that of comparative example 2. Presumably, this occurred because the capacitance electric power increased due to a relative permittivity higher than that of comparative example 2.

Fabrication and Evaluation of Liquid Ejection Head

Example 10

A liquid ejection head having the structure shown in FIG. 5B was made by using the piezoelectric element according to Example 1. Ink was ejected in accordance with an electric signal that was input. At this time, increase in power consumption was not observed.

Fabrication and Evaluation of Liquid Ejection Apparatus

Example 11

A liquid ejection apparatus having the structure shown in FIG. 6 was made by using the piezoelectric element according to Example 10. Ink was ejected to a recording medium in accordance with an electric signal that was input. At this time, increase in power consumption was not observed.

Fabrication and Evaluation of Ultrasonic Motor

Example 12

An ultrasonic motor having the structure shown in FIG. 8 was made by using the piezoelectric element according to Example 1. The motor rotated in accordance with application of alternating voltage. At this time, increase in power consumption was not observed.

Fabrication and Evaluation of Optical Device

Example 13

An optical device having the structure shown in FIGS. 9A and 9B was made by using the ultrasonic motor according to Example 12. It was observed that an auto-focusing operation was performed in accordance with application of alternating voltage. At this time, increase in power consumption was not observed.

Fabrication and Evaluation of Dust Removing Device

Example 14

A dust removing device having the structure shown in FIG. 11 was made by using the ultrasonic motor according to Example 1. Plastic beads were scattered, an alternating voltage was applied, and the plastic beads (example of dust) were removed efficiently. At this time, increase in power consumption was not observed.

Fabrication and Evaluation of Imaging Apparatus

Example 15

An imaging apparatus having the structure shown in FIG. 14 was made by using the dust removing device according to Example 14. When the imaging apparatus was operated, dust on a surface of an imaging unit was effectively removed and an image without defect due to dust was obtained. At this time, increase in power consumption was not observed.

Fabrication and Evaluation of Electronic Apparatus

Example 16

An electronic apparatus having the structure shown in FIG. 16 was made by using the piezoelectric element according to Example 1. The electronic apparatus functioned as a speaker in accordance with application of an alternating voltage. At this time, increase in power consumption was not observed.

The piezoelectric element according to the present invention, which has a high electromechanical coupling factor and a low power consumption, can be driven with high efficiency. Because the piezoelectric element is lead-free, the environment load is small. Therefore, the piezoelectric element according to the present invention can be efficiently used in apparatuses that include multiple piezoelectric elements, such as a liquid ejection head, an ultrasonic motor, and a dust removing device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-014469, filed Jan. 29, 2014, which is hereby incorporated by reference in its entirety.

What is claimed is:

1. A piezoelectric element comprising:
a first electrode;
a piezoelectric material portion; and
a second electrode,
wherein the piezoelectric material portion is made of a piezoelectric ceramic that includes a perovskite-type metal oxide including barium titanate and Mn and that has residual polarization,
wherein the piezoelectric material portion has a measurement surface extending in a direction that crosses a direction of the residual polarization of the piezoelectric ceramic, and, after the measurement surface has been polished to have a surface roughness of 200 nm or less, the measurement surface has a (002)/(200) X-ray diffraction intensity ratio of 1.0 or more at room temperature,
wherein a ratio c/a of a c-axis lattice constant c to an a-axis lattice constant a of the piezoelectric ceramic at room temperature satisfies $1.004 \leq c/a \leq 1.010$, and
wherein a half-width of a (002) diffraction peak of the measurement surface at room temperature is 1.2° or less.

2. The piezoelectric element according to claim 1, wherein the perovskite-type metal oxide is represented by the following general formula:

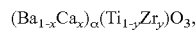

$$(Ba_{1-x}Ca_x)_\alpha(Ti_{1-y}Zr_y)O_3,$$

where $0.125 \leq x \leq 0.300$, $0.041 \leq y \leq 0.080$, and $0.986 \leq \alpha \leq 1.020$.

3. The piezoelectric element according to claim 1, wherein a Mn content of the piezoelectric ceramic is 0.04 parts by weight or more and 0.50 parts by weight or less with respect to 100 parts by weight of the perovskite-type metal oxide in terms of metal.

4. The piezoelectric element according to claim 1, wherein the piezoelectric ceramic further includes Bi.

5. The piezoelectric element according to claim 4, wherein a Bi content of the piezoelectric ceramic is 0.04 parts by weight or more and 0.80 parts by weight or less with respect to 100 parts by weight of the perovskite-type metal oxide in terms of metal.

6. The piezoelectric element according to claim 1, wherein an electromechanical coupling factor $k_{31}$ of the piezoelectric ceramic at room temperature is 0.200 or more.

7. The piezoelectric element according to claim 1, wherein a mechanical quality factor Qm of the piezoelectric ceramic at room temperature is 400 or more.

8. The piezoelectric element according to claim 1, wherein a relative permittivity $\varepsilon r$ of the piezoelectric ceramic at room temperature is 2500 or less.

9. A method for manufacturing the piezoelectric element according to claim 1, the method comprising the sequential steps of:
making a compact composed of a powder material;
obtaining a piezoelectric ceramic by sintering the compact;
forming a first electrode and a second electrode on the piezoelectric ceramic; and polarizing the piezoelectric ceramic,
wherein the step of forming the first electrode and the second electrode on the piezoelectric ceramic includes heat-treating the piezoelectric ceramic, the first electrode, and the second electrode in a temperature range having a highest temperature from 700° C. to 900° C. and cooling the piezoelectric ceramic, the first electrode, and the second electrode at a rate of 100° C./h or more.

10. The method for manufacturing the piezoelectric element, according to claim 9,
wherein the step of polarizing the piezoelectric ceramic includes heating the piezoelectric ceramic, applying a direct-current voltage to the piezoelectric ceramic, and cooling the piezoelectric ceramic at a rate of 100° C./h or more while continuing application of the voltage.

11. A liquid ejection head comprising:
a liquid chamber provided with a vibration unit including the piezoelectric element according to claim 1; and
an ejection port connected to the liquid chamber.

12. A liquid ejection apparatus comprising:
a placement portion for placing a transferred object thereon; and
the liquid ejection head according to claim 11.

13. An ultrasonic motor comprising:
a vibration body including the piezoelectric element according to claim 1; and
a movable body that contacts the vibration body.

14. An optical device comprising:
a driving unit including the ultrasonic motor according to claim 13.

15. A vibration device comprising:
a vibration body including a diaphragm and the piezoelectric element according to claim 1 on the diaphragm.

16. A dust removing device comprising:
a vibration unit including the vibration device according to claim 15.

17. An imaging apparatus comprising:
the dust removing device according to claim 16; and
an imaging element unit,
wherein the diaphragm of the dust removing device is disposed on a light-receiving side of the imaging element unit.

18. An electronic apparatus comprising:
a piezoelectric acoustic component including the piezoelectric element according to claim 1.

* * * * *